US012787506B2

(12) United States Patent
Zhang et al.

(10) Patent No.: US 12,787,506 B2
(45) Date of Patent: Nov. 3, 2026

(54) LIGHT-EMITTING MODULE AND DISPLAY DEVICE

(71) Applicants: Beijing BOE Display Technology Co., Ltd., Beijing (CN); BOE Technology Group Co., Ltd., Beijing (CN)

(72) Inventors: Zhizhong Zhang, Beijing (CN); Yanjun Sun, Beijing (CN); Lei Liu, Beijing (CN)

(73) Assignees: Beijing BOE Display Technology Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 1017 days.

(21) Appl. No.: 17/908,313

(22) PCT Filed: Oct. 22, 2021

(86) PCT No.: PCT/CN2021/125864
§ 371 (c)(1),
(2) Date: Aug. 31, 2022

(87) PCT Pub. No.: WO2022/160803
PCT Pub. Date: Aug. 4, 2022

(65) Prior Publication Data
US 2023/0095991 A1 Mar. 30, 2023

(30) Foreign Application Priority Data
Feb. 1, 2021 (CN) ........................ 202110135974.0

(51) Int. Cl.
*H10H 20/841* (2025.01)
*H10H 20/831* (2025.01)
(Continued)

(52) U.S. Cl.
CPC ...... *H10H 20/841* (2025.01); *H10H 20/8312* (2025.01); *H10H 20/8514* (2025.01); *H10H 20/857* (2025.01); *H10H 29/142* (2025.01)

(58) Field of Classification Search
CPC ......... G02F 1/133602; G02F 1/133603; G02F 1/133606; H10H 29/30; H10H 29/882; F21Y 2105/16
(Continued)

(56) References Cited

U.S. PATENT DOCUMENTS 5,921,651 A 7/1999 Ishikawa
7,178,964 B2 2/2007 Sugiura et al.
(Continued)

FOREIGN PATENT DOCUMENTS

CN 1790122 A 6/2006
CN 101140335 A 3/2008
(Continued)

OTHER PUBLICATIONS

Machine translate CN111061091 (Apr. 24, 2020) (Year: 2020).*
(Continued)

*Primary Examiner* — Abdulmajeed Aziz
(74) *Attorney, Agent, or Firm* — ArentFox Schiff LLP; Michael Fainberg

(57) ABSTRACT

A light-emitting module and a display device, for use in mitigating the problems in the prior art that light-emitting modules have light shadow, non-uniform light emitting, and great thicknesses. The light-emitting module is configured to provide a light source for a display panel. The light-emitting module comprises: a light-emitting substrate, the light-emitting substrate being provided with a plurality of light-emitting elements arranged in an array; and an optical film group, the optical film group being located on a light-emitting side of the light-emitting substrate, the optical film
(Continued)

group at least comprising a diffusion plate, and the orthographic projection of all the light-emitting elements on the light-emitting substrate on the diffusion plate falling within the diffusion plate. At least a partial area of the light-emitting substrate is in direct physical contact with the diffusion plate.

36 Claims, 15 Drawing Sheets

(51) Int. Cl.
*H10H 20/851* (2025.01)
*H10H 20/857* (2025.01)
*H10H 29/14* (2025.01)

(58) Field of Classification Search
USPC .......................................................... 362/97.3
See application file for complete search history.

(56) References Cited

U.S. PATENT DOCUMENTS 7,654,687 B2 * 2/2010 Tsai ..................... G02B 6/0021 362/97.3
8,814,391 B2 * 8/2014 Koh ..................... G02B 6/0021 362/311.06
2006/0133112 A1 6/2006 Liao
2007/0159699 A1 7/2007 Wang et al.
2008/0062718 A1 3/2008 Liao
2008/0129923 A1 6/2008 Hu
2008/0246902 A1 10/2008 Cheng
2008/0303777 A1 12/2008 Inoue et al.
2009/0296020 A1 12/2009 Chen et al.
2010/0046247 A1 2/2010 Liu et al.
2010/0110330 A1 * 5/2010 Ajichi .................. G02B 6/0068 362/97.3
2011/0304796 A1 * 12/2011 Lee ...................... G02B 6/0073 362/97.3
2012/0069579 A1 3/2012 Koh et al.
2019/0187519 A1 6/2019 Kim et al.
2019/0243055 A1 8/2019 Li et al.
2019/0285941 A1 9/2019 Liu et al.
2020/0074917 A1 3/2020 Li et al.
2021/0026203 A1 1/2021 Kim et al.
2022/0137463 A1 * 5/2022 Qin ................... G02F 1/133603 362/97.3
2023/0176412 A1 * 6/2023 Zhou .................. G06V 40/1365 349/12

FOREIGN PATENT DOCUMENTS

CN 101655635 A 2/2010
CN 103672569 A 3/2014
CN 103760716 A 4/2014
CN 105068315 A 11/2015
CN 205137209 U 4/2016
CN 106569363 A 4/2017
CN 106773315 A 5/2017
CN 106842701 A 6/2017
CN 107515491 A 12/2017
CN 107728379 A 2/2018
CN 206990979 U 2/2018
CN 108008576 A 5/2018
CN 109116626 A 1/2019
CN 109375402 A 2/2019
CN 209215812 U 8/2019
CN 210181346 U 3/2020
CN 111061091 A * 4/2020 ........ G02F 1/133611
CN 210573097 U 5/2020
CN 210639389 U 5/2020
CN 210865431 U 6/2020
CN 211980636 U 11/2020
CN 212255958 U 12/2020
KR 10-2006-0115948 A 11/2006
KR 10-2071472 B1 1/2020
TW 200823553 A 6/2008
TW 200841089 A 10/2008
TW 200949301 A 12/2009
TW 201945806 A 12/2019

OTHER PUBLICATIONS

Office Action for TW application No. 110136841 dated Oct. 14, 2022.
Hearing Notice received for Indian Patent Application No. 202317000654, mailed on May 14, 2026, 4 pages.
Office Action received for Chinese Patent Application No. 202110135974.0, mailed on Jun. 17, 2026, 33 pages (21 pages of English Translation and 12 pages of Original Document).

* cited by examiner

LIGHT-EMITTING MODULE AND DISPLAY DEVICE

CROSS REFERENCE TO RELATED APPLICATION

The present application is a National Stage of International Application No. PCT/CN2021/125864, filed on Oct. 22, 2021, which claims the priority to Chinese Patent Application No. 202110135974.0, filed to the Chinese Patent Office on Feb. 1, 2021 and entitled "LIGHT EMITTING MODULE AND DISPLAY DEVICE", both of which are incorporated in their entireties herein by reference.

FIELD

The present disclosure relates to the technical field of display, and in particular to a light emitting module and a display device.

BACKGROUND

The light emitting module is to provide the display product with the light source, and divided into the side entry type and the direct type according to different light source distribution positions. The direct type light source is superior to the side entry light source in terms of light emitting uniformity and light emitting brightness. Compared with the side entry light source, it is easier for the direct type light source to realize the high-dynamic range (HDR).

SUMMARY

An embodiment of the present disclosure provides a light emitting module, used for providing a display panel with a light source and including:

a light emitting substrate, the light emitting substrate being provided with a plurality of light emitting elements arranged in an array; and an optical film group, the optical film group being positioned on a light emitting side of the light emitting substrate, the optical film group at least including a diffusion plate, and orthographic projections, on the diffusion plate, of all the light emitting elements positioned on the light emitting substrate being positioned in the diffusion plate; where at least some regions of the light emitting substrate are in direct physical contact with the diffusion plate.

In a possible implementation, the light emitting substrate includes: a base plate, and a first reflective layer positioned on one side, facing the diffusion plate, of the base plate; and the first reflective layer includes a plurality of hollows arranged at intervals, the hollow being arranged corresponding to the light emitting element, and an orthographic projection, on the base plate, of at least one of the light emitting elements being positioned in an orthographic projection, on the base plate, of the corresponding hollow.

In a possible implementation, a surface, away from the base plate, of the first reflective layer is in direct physical contact with the diffusion plate, and/or a surface, away from the base plate, of the light emitting element is in direct physical contact with the diffusion plate.

In a possible implementation, in a plane parallel to the base plate, a minimum distance between centers of any two light emitting elements adjacent to each other is taken as a first distance; and a distance between the surface, away from the base plate, of the light emitting element, and a surface, facing the light emitting substrate, of the diffusion plate is taken as a second distance, the first distance being greater than the second distance.

In a possible implementation, the first reflective layer includes a body portion and an extension portion, the extension portion being positioned on at least one side of the body portion.

In a possible implementation, the body portion and the extension portion are integrated, and a first angle is formed between the extension portion and the body portion, the first angle being not equal to 0.

In a possible implementation, the light emitting substrate includes at least one support member, the support member being positioned on one side, where the light emitting element is positioned, of the base plate, and the support member being in direct physical contact with the diffusion plate.

In a possible implementation, the support member is arranged corresponding to at least one of the hollows, an orthographic projection, on the base plate, of the support member at least partially overlapping an orthographic projection, on the base plate, of the corresponding hollow.

In a possible implementation, the light emitting substrate further includes: a second reflective layer positioned between the base plate and the first reflective layer; and a distance between a surface, away from the base plate, of the second reflective layer and the base plate is smaller than a maximum distance between the surface, away from the base plate, of the light emitting element and the base plate.

In a possible implementation, the light emitting substrate further includes: a first wire layer positioned between the base plate and the second reflective layer, and a second wire layer positioned on one side, away from the first reflective layer, of the base plate.

In a possible implementation, the light emitting substrate includes a plurality of light emitting sub-substrates, the plurality of light emitting sub-substrates being arranged in sequence at least in a first direction and/or a second direction, and the plurality of light emitting sub-substrates being spliced to form the light emitting substrate.

In a possible implementation, at least two of the light emitting sub-substrates are arranged corresponding to the same first reflective layer, and the at least two light emitting sub-substrates are positioned in a region, of an orthographic projection, on the base plate, of the first corresponding reflective layer.

In a possible implementation, a first gap is provided between light emitting sub-substrates adjacent to each other in an arrangement direction, the first gap being 0.08 mm-0.12 mm.

In a possible implementation, each light emitting sub-substrate is provided with a plurality of light emitting units arranged in an array, each light emitting unit including a plurality of light emitting elements connected in series, and the plurality of light emitting elements connected in series being arranged in an array.

In a possible implementation, the light emitting module further includes light emitting control chips corresponding one-to-one to the plurality of light emitting sub-substrates; where input ends of n light emitting units are electrically connected to the same positive electrode output pin of the light emitting control chip, and output ends of m light emitting units are electrically connected to the same negative electrode output pin of the light emitting control chip, n being smaller than the total number of the light emitting units in the light emitting sub-substrate, and m being smaller than the total number of the light emitting units in the light emitting sub-substrate.

In a possible implementation, the light emitting substrate further includes a first region and a second region, an orthographic projection, on the light emitting substrate, of the second region being positioned in the first region, and the orthographic projection, on the light emitting substrate, of the second region having a smaller area than an orthographic projection, on the light emitting substrate, of the first region; the second region overlaps a display region of the display panel; and the light emitting substrate further includes a third region, an orthographic projection, on the light emitting substrate, of the third region being positioned in the first region, the orthographic projection, on the light emitting substrate, of the third region not overlapping the orthographic projection, on the light emitting substrate, of the second region, and a plurality of light emitting elements being arranged in the third region.

In a possible implementation, in a direction parallel to a first extension direction, a maximum distance between the light emitting element positioned in the third region and an edge of the second region is 0.5 mm-1.5 mm; and in a direction parallel to a second extension direction, a maximum distance between the light emitting element in the third region and the edge of the second region is 0.5 mm-1.5 mm, where the first region is a rectangle, the first extension direction is an extension direction of a longer side of the rectangle, and the second extension direction is an extension direction of a shorter side of the rectangle.

In a possible implementation, the optical film group further includes: a diffusion sheet positioned on one side, away from the light emitting substrate, of the diffusion plate, the diffusion sheet including a first surface facing the diffusion plate, and a second surface away from the diffusion plate; and at least one of the first surface and the second surface is provided with a plurality of microstructure unit, a light conversion material being arranged at a corresponding position of each microstructure unit.

In a possible implementation, the diffusion sheet includes an inner region, and a peripheral region positioned on at least one side of the inner region, an orthographic projection, on the diffusion sheet, of the second region of the light emitting substrate overlapping the peripheral region; and the microstructure unit is only positioned in the peripheral region.

In a possible implementation, the first surface is a rectangle, an extension direction of a longer side of the rectangle is taken as a third direction, and a direction of a shorter side of the rectangle is taken as a fourth direction; the peripheral region further includes corner regions, the corner region being a region formed through an intersection between a portion, extending in the third extension, of the peripheral region, and a portion, extending in the fourth direction, of the peripheral region;

a density distribution of the microstructure units in the corner region satisfies the following relational expression:

$$Z = \lambda F_x * F_y;$$

in a region between two corner regions adjacent to each other in the third direction, a density distribution of the microstructure units satisfies the following relational expression:

$$Z = e^{-\left(\frac{i-12}{16}\right)^2};$$

and in a region between two corner regions adjacent to each other in the fourth direction, a density distribution of the microstructure units satisfies the following relational expression:

$$Z = e^{-\left(\frac{j-12}{16}\right)^2};$$

wherein $$F_x = e^{-\left(\frac{i-12}{16}\right)^2}, F_y = e^{-\left(\frac{j-12}{85}\right)^2},$$

each portion, parallel to the third direction, of the peripheral region is equally divided into I divided regions from outside to inside in sequence in the fourth direction, and each portion, parallel to the fourth direction, of the peripheral region is equally divided into J divided regions from outside to inside in sequence in the third direction, i denoting the ith region, in the fourth direction, of the microstructure unit, i=1, 2, . . . I, j denoting a region, in the third direction, of the microstructure unit, j=1, 2, . . . J, and λ being an empirical constant.

In a possible implementation, an outer contour of an orthographic projection, on the diffusion sheet, of the first region of the light emitting substrate is positioned in the peripheral region, and an outer contour of an orthographic projection, on the diffusion sheet, of the second region of the light emitting substrate is positioned in the peripheral region.

In a possible implementation, the peripheral region includes a first peripheral region and a second peripheral region, the second peripheral region being positioned on one side, away from the inner region, of the first peripheral region; and the microstructure units in the first peripheral region have a smaller average distribution density than those in the second peripheral region.

In a possible implementation, a distribution density, in a unit area, of the microstructure units is gradually reduced in a direction from the second peripheral region to the first peripheral region.

In a possible implementation, the outer contour of the orthographic projection, on the diffusion sheet, of the first region of the light emitting substrate is positioned in the second peripheral region, and the outer contour of the orthographic projection, on the diffusion sheet, of the second region of the light emitting substrate is positioned in the first peripheral region.

In a possible implementation, the second peripheral region further includes a corner region, the corner region being a region formed through an intersection between a portion, extending in the first extension direction, of the second peripheral region, and a portion, extending in the second extension direction, of the second peripheral region; and the microstructure units in the corner region have a greater average distribution density than those in the other regions of the second peripheral region.

In a possible implementation, the plurality of microstructure units are positioned on the second surface, the inner region of the second surface has substantially the same roughness as the first surface, and the first surface has smaller roughness than the peripheral region.

In a possible implementation, the light emitting module further includes a backplane positioned on one side, away from the diffusion plate, of the light emitting substrate, the backplane including: a bottom plate, and a side plate extending from the bottom plate towards one side of the diffusion plate; where a first adhesive body is arranged on one side, facing the backplane, of the light emitting substrate, the light emitting substrate being fixed to the backplane through the first adhesive body.

In a possible implementation, the first adhesive body includes a adhesive body base material, a first adhesive layer positioned on one side, facing the light emitting sub-substrate, of the adhesive body base material, and a second adhesive layer positioned on one side, facing the bottom plate, of the adhesive body base material.

In a possible implementation, a surface, facing the light emitting substrate, of the diffusion plate is provided with a plurality of microstructures, the microstructure being a recess relative to the surface, facing the light emitting substrate, of the diffusion plate.

In a possible implementation, the microstructure is a pyramid structure, a bottom surface of the pyramid structure being a virtual surface coplanar with the surface, facing the light emitting substrate, of the diffusion plate.

In a possible implementation, a surface, away from the light emitting substrate, of the diffusion plate has smaller roughness than the surface, facing the light emitting substrate, of the diffusion plate.

In a possible implementation, the diffusion plate has a thickness of 2.5 mm-3.5 mm.

In a possible implementation, the diffusion plate includes a diffusion body, and a light diffusion agent and shielding particles mixed in the diffusion body.

In a possible implementation, the diffusion plate includes a diffusion body, and a plurality of closed cavities positioned in the body, the cavity being filled with air.

In a possible implementation, the diffusion plate is provided with a first diffusion surface facing the light emitting substrate, a second diffusion surface away from the light emitting substrate, and at least one side surface connecting the first diffusion surface to the second diffusion surface; and at least one of the side surfaces is provided with a third reflective layer.

In a possible implementation, the optical film group further includes: a light conversion film positioned between the diffusion plate and the diffusion sheet.

In a possible implementation, in a direction parallel to the side surface and perpendicular to the second diffusion surface, a second gap is provided between the third reflective layer and the light conversion film.

In a possible implementation, the light emitting element is a mini light emitting diode (Mini-LED).

An embodiment of the present disclosure provides a display device, including the light emitting module provided in the embodiment of the present disclosure, and further including: a display panel positioned on a light emitting side of the light emitting module.

In a possible implementation, a backplane includes a bottom plate, and a side plate extending from the bottom plate towards one side of a diffusion plate; and the display device further includes: a plastic frame fixed to an end portion of the side plate, the display panel being fixed to the plastic frame through foam.

In a possible implementation, the light emitting module further includes: a front frame positioned on one side, away from a light emitting substrate, of the backplane, the front frame including: a bottom frame for accommodating the plastic frame and the backplane, and a side frame extending from the bottom frame towards one side of the display panel, and the front frame being fixed to the bottom plate through a nut.

In a possible implementation, the light emitting module further includes: a rear housing positioned on one side, away from the backplane, of the bottom frame, the rear housing being fixed to the front frame through a buckle.

DETAILED DESCRIPTION OF THE EMBODIMENTS

In order to make the objectives, technical solutions, and advantages in the embodiments of the present disclosure clearer, the technical solutions in the embodiments of the present disclosure will be clearly and completely described below in combination with the accompanying drawings in the embodiments of the present disclosure. It is obvious that the described embodiments are some, rather than all, of the embodiments of the present disclosure. Based on the described embodiments of the present disclosure, all other embodiments obtained by a person of ordinary skill in the art without making inventive efforts fall within the scope of protection of the present disclosure.

Unless defined otherwise, technical or scientific terms used in the present disclosure should be of ordinary meaning as understood by a person of ordinary skill in the art to which the present disclosure pertains. Words "first", "second", etc. used in the present disclosure do not denote any order, quantity, or importance, but are merely used to distinguish between different components. Words "comprising", "encompassing" or the like is intended to mean that an element or item in front of the word encompasses elements or items that present behind the word and equivalents thereof, but does not exclude other elements or items. Words "connection", "connected" or the like is not limited to physical or mechanical connections, but may include an electrical connection, whether direct or indirect. "Upper", "lower", "left", "right", etc. are merely used to indicate a relative position relation, which may also change accordingly when an absolute position of a described object changes.

To keep the following description of the embodiments of the present disclosure clear and concise, the detailed descriptions of known functions and components are omitted from the present disclosure.

Figure 1:
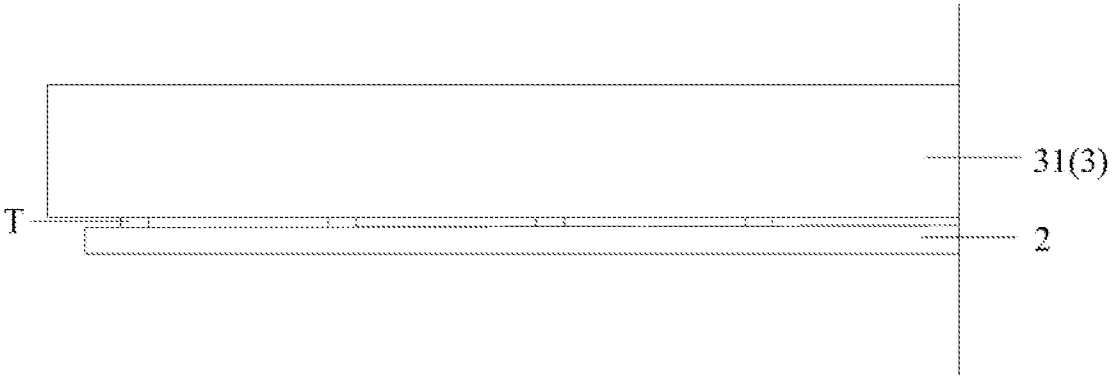
FIG. 1 is a first sectional structural schematic diagram of a light emitting module provided in an embodiment of the present disclosure.

An embodiment of the present disclosure provides a light emitting module used for providing a display panel with a light source. As shown in FIG. 1, the light emitting module includes:

- a light emitting substrate 2 being provided with a plurality of light emitting elements T arranged in an array, and the light emitting elements T being positioned on at least one side of the light emitting substrate 2; and
- an optical film group 3 being positioned on a light emitting side of the light emitting substrate 2, the optical film group 3 at least including a diffusion plate 31, and orthographic projections, on the diffusion plate 31, of all the light emitting elements T positioned on the light emitting substrate 2 being positioned in the diffusion plate 31; where
- at least some regions of the light emitting substrate 2 are in direct physical contact with the diffusion plate 31.

In some embodiments of the present disclosure, the light emitting module includes: the light emitting substrate 2, and the optical film group 3, the optical film group 3 being positioned on the light emitting side of the light emitting substrate 2, the optical film group 3 at least including the diffusion plate 31, and the orthographic projections, on the diffusion plate 31, of all the light emitting elements T positioned on the light emitting substrate 2 being positioned in the diffusion plate 31. Therefore, light rays emitted by the light emitting element T are all modulated by the diffusion plate 31, to ensure uniform light emergence, avoiding a lamp shadow, and to avoid a situation that unmodulated light rays directly leak from an edge, resulting in an obvious bright region on the periphery. It should be noted that the orthographic projection herein is an orthographic projection in a thickness direction of the diffusion plate 31, that is, the orthographic projections, in the thickness direction of the diffusion plate 31, of all the light emitting elements T on the light emitting substrate 2 are all positioned in a region of an orthographic projection, in the direction, of the diffusion plate 31. Further, an orthographic projection, on the diffusion plate 31, of the light emitting substrate 2 may be positioned in the region of the orthographic projection of the diffusion plate 31, the region of the orthographic projection, in the direction, of the light emitting substrate 2 has a smaller area than that of the orthographic projection, in the direction, of the diffusion plate 31, so as to reduce a size of the light emitting substrate while ensuring that the light rays emitted by all the light emitting elements T on the light emitting substrate 2 are modulated by the diffusion plate 31, thereby realizing a narrow frame of the light emitting module. Moreover, at least some regions of the light emitting substrate 2 are in direct physical contact with the diffusion plate 31, so that an entire light emitting module has a small thickness, and the light emitting module is ultrathin.

Figure 2A:
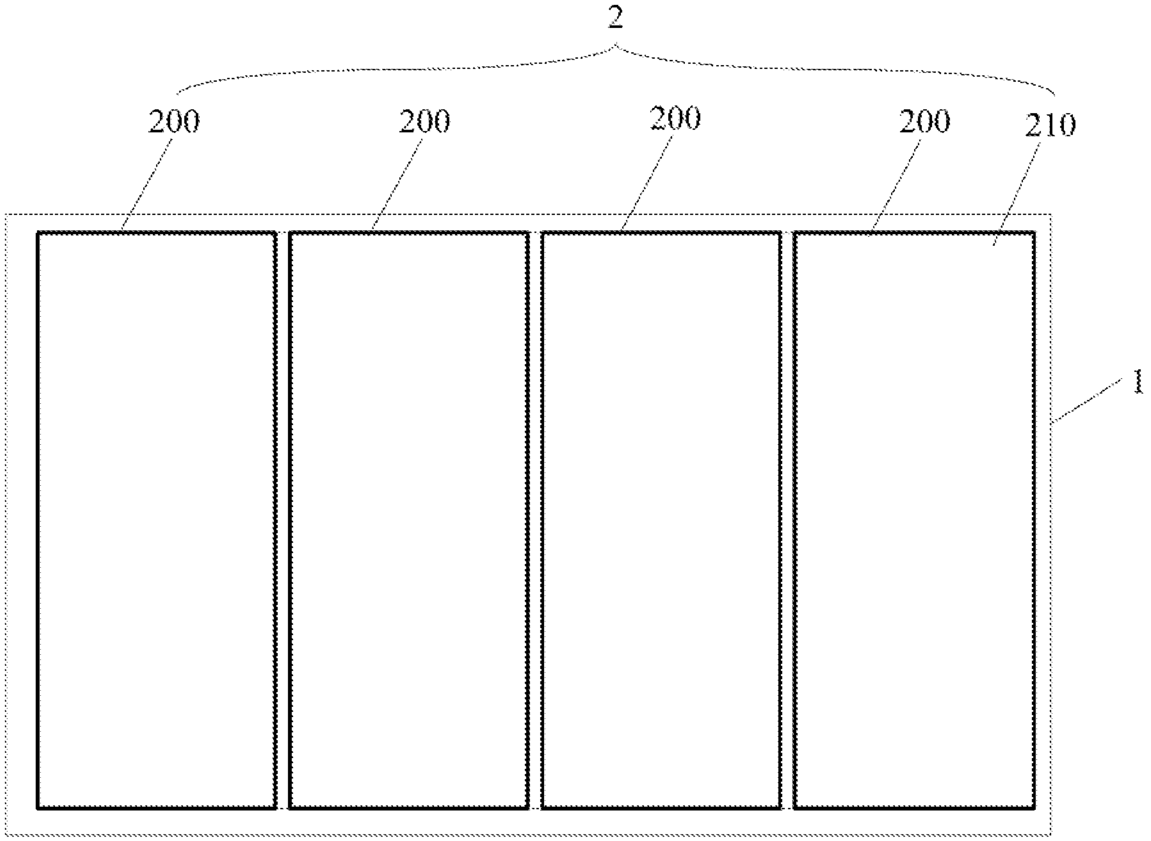
FIG. 2A is a structural schematic arrangement diagram of a light emitting sub-substrate provided in an embodiment of the present disclosure.
Figure 2B:
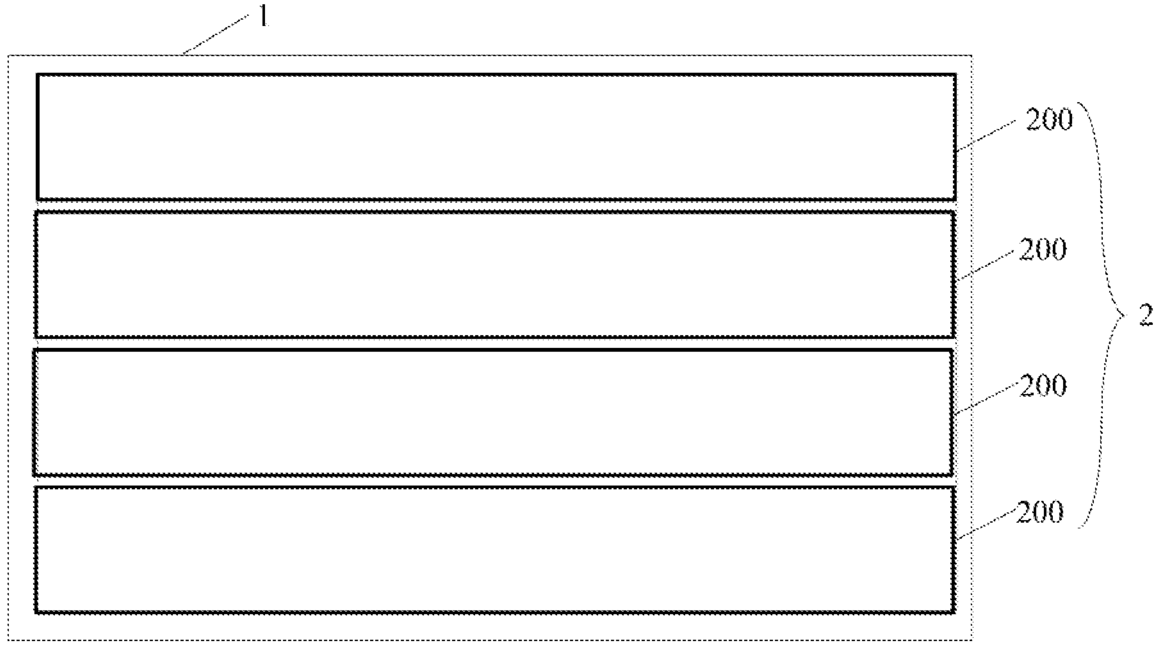
FIG. 2B is a structural schematic arrangement diagram of another light emitting sub-substrate provided in an embodiment of the present disclosure.

In a specific implementation, as shown in FIGS. 2A and 2B, the light emitting substrate 2 includes a plurality of light emitting sub-substrates 200. In some embodiments, the plurality of light emitting sub-substrates 200 are arranged in sequence at least in a first direction. For example, the light emitting sub-substrates may be arranged in sequence in a transverse direction as shown in FIG. 2A, where the first direction is the transverse direction; and the light emitting sub-substrates may also be arranged in sequence in a vertical direction as shown in FIG. 2B, where the first direction is the vertical direction. The plurality of light emitting sub-substrates 200 which are arranged in the transverse direction are schematically described as an example below.

Figure 2C:
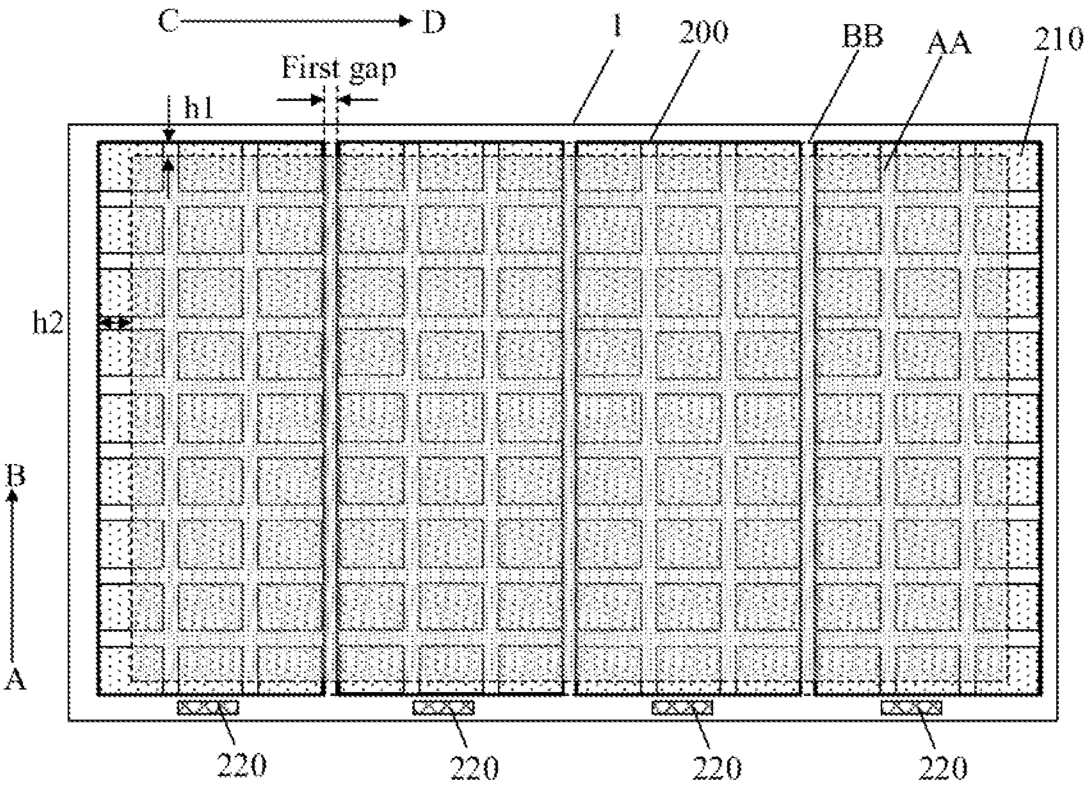
FIG. 2C is a structural schematic diagram from a top view of a light emitting substrate provided in an embodiment of the present disclosure.

As shown in FIG. 2C, a first gap is provided between light emitting sub-substrates 200 adjacent to each other in an arrangement direction, the first gap being 0.08 mm-0.12 mm. The plurality of light emitting sub-substrates 200 are spliced to form the light emitting substrate 2. In embodiments of the present disclosure, the light emitting substrate 2 includes the plurality of light emitting sub-substrates 200 arranged in sequence in the same direction, the plurality of light emitting sub-substrates 200 being spliced to form the light emitting substrate 2, so that the light emitting substrate 2 may be prevented from being of an integrated structure which is large in size, prone to be damaged, and unconducive to assembly of the light emitting module. In some embodiments, the first gap between light emitting sub-substrates 200 adjacent to each other is 0.1 (±0.02) mm.

Figure 3:
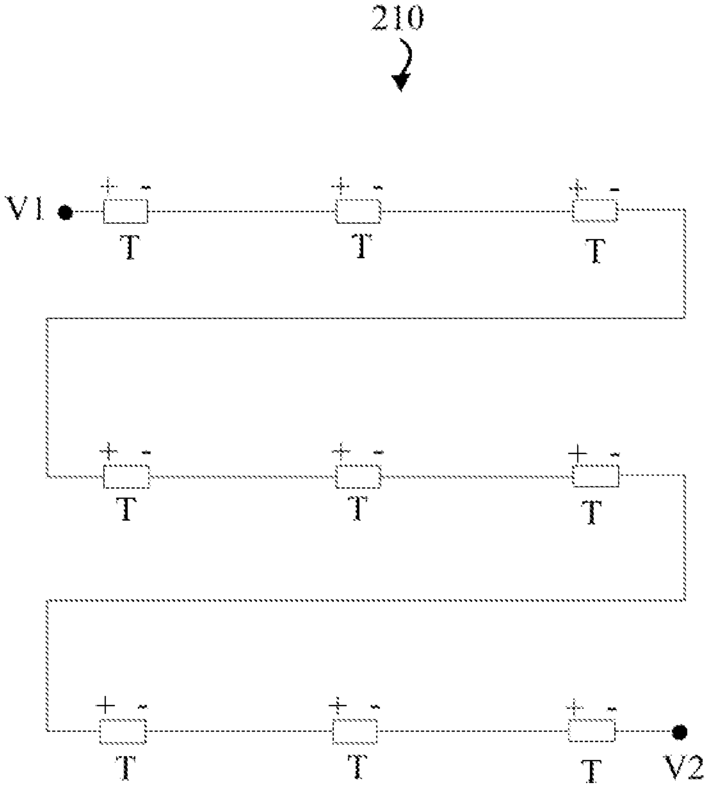
FIG. 3 is a structural schematic diagram of a light emitting unit provided in an embodiment of the present disclosure.

In a specific implementation, as shown in FIG. 2C, each light emitting sub-substrate 200 is provided with a plurality of light emitting units 210 arranged in an array. As shown in FIG. 3, each light emitting unit 210 includes an input end V1, an output end V2, and a plurality of light emitting elements T electrically connected between the input end V1 and the output end V2 and sequentially connected in series, so that independent light emitting control over each light emitting unit 210 may be realized. For example, each light emitting unit 210 includes 9 light emitting elements T connected in series in sequence. It should be noted that in FIG. 2C, each light emitting sub-substrate 200 provided with light emitting units 210 arranged in 9 rows and 3 columns is schematically described as an example. In FIG. 3, each light emitting unit 210 provided with light emitting elements T in 3 rows and 3 columns is schematically described as an example. In a specific implementation, each light emitting sub-substrate 200 may also be provided with light emitting units 210 in other numbers of rows and columns, and each light emitting unit 210 may be provided with light emitting elements T in other numbers of rows and columns, to which the present disclosure is not limited.

In a specific implementation, the light emitting element T provided in the embodiment of the present disclosure may be a mini light emitting diode (Mini-LED). With a small size and high brightness, the Mini-LED may be applied to a backlight module of a display device in a wide range, to finely adjust backlight, thereby displaying a high-dynamic range (HDR). For example, the Mini-LED has a typical size (for example, a length) of 50 microns-150 microns, for example, 80 microns-120 microns.

In a specific implementation, as shown in FIG. 2C, the light emitting module further includes light emitting control chips 220 corresponding one-to-one to the light emitting sub-substrates 200. In some embodiments, each light emitting sub-substrate 200 is correspondingly provided with one light emitting control chip 220 for driving the light emitting sub-substrate 200. Input ends V1 of n light emitting units 210 are electrically connected to the same positive electrode output pin of the light emitting control chip 220, and output ends of m light emitting units are electrically connected to the same negative electrode output pin of the light emitting control chip 220, where n is less than the total number of the light emitting units 210 in the light emitting sub-substrate 200, and m is less than the total number of the light emitting units 210 in the light emitting sub-substrate 200. Therefore, a signal outputted by one output pin of the light emitting control chip 220 may be used to control light emitting of the plurality of light emitting units 210 simultaneously, and regional control and local dimming of the light emitting module are realized. For example, the light emitting control chip 220 includes PIN1-96, where PIN1-24 are positive electrode pins, PIN25-96 are negative electrode pins, 4 light emitting units 210 share one negative electrode pin, and 12 light emitting units 210 share one positive electrode pin. Specifically, for example, input ends V1 of the 12 light emitting units 210 may all be electrically connected to the same positive electrode pin, and output ends V2 of the 4 light emitting units 210 may all be electrically connected to the same negative electrode pin, so that the 12 light emitting units 210 share one positive electrode pin, and the 4 light emitting units 210 share one negative electrode pin.

Figure 4A:
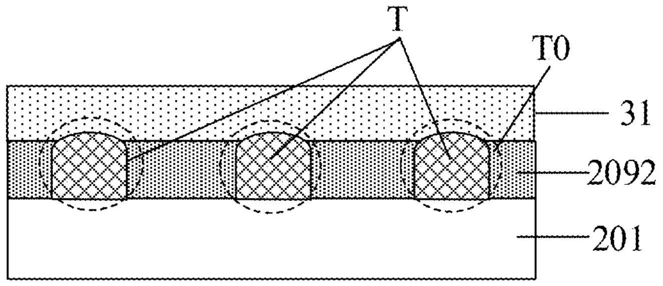
FIG. 4A is a first sectional structural schematic diagram of a light emitting substrate provided in an embodiment of the present disclosure.

In a specific implementation, as shown in FIG. 4A, each light emitting sub-substrate 200 includes: a base plate 201, and a first reflective layer 2092 positioned on one side, facing the diffusion plate 31, of the base plate 201. The first reflective layer 2092 includes a plurality of hollows TO arranged at intervals, the hollow T0 being arranged corresponding to the light emitting element T, and an orthographic projection, on the base plate 201, of at least one light emitting element T being positioned in an orthographic projection, on the base plate 201, of the corresponding hollow T0. Accordingly, a surface, away from the base plate 201, of the first reflective layer 2092 is in direct physical contact with the diffusion plate 31, and/or a surface, away from the base plate 201, of the light emitting element T is in direct physical contact with the diffusion plate 31.

Figure 4B:
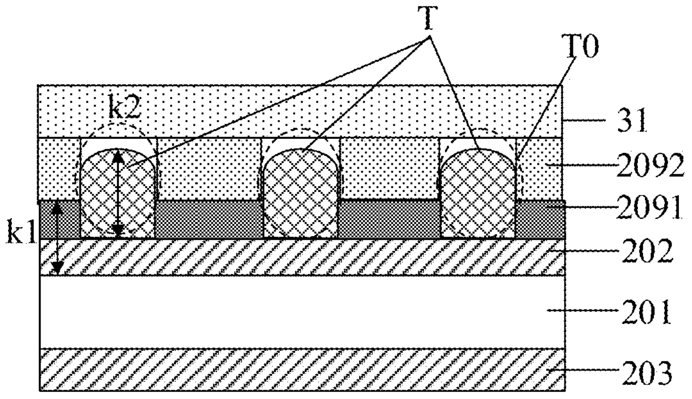
FIG. 4B is a second sectional structural schematic diagram of a light emitting substrate provided in an embodiment of the present disclosure.

In a specific implementation, as shown FIG. 4B, each light emitting sub-substrate 200 includes: a first wire layer 202 positioned between the base plate 201 and the first reflective layer 2092, a second reflective layer 2091 positioned between the first wire layer 202 and the first reflective layer 2092, and a second wire layer 203 positioned on one side, away from the first reflective layer 2092, of the base plate 201. A distance k1 between a surface, away from the base plate 201, of the second reflective layer 2091 and the base plate 201 is smaller than a maximum distance k2 between the surface, away from the base plate 201, of the light emitting element T and the first wire layer 202. When the surface, away from the base plate 201, of the light emitting element T is cambered, the maximum distance k2 between the surface, away from the base plate 201, of the light emitting element T and the first wire layer 202 is a maximum distance between an apex of the surface, away from the base plate 201, of the light emitting element T and the base plate 201. In the embodiment of the present disclosure, the first wire layer 202 and the second wire layer 203 are arranged on two surfaces of the base plate 201, respectively, so as to reduce routing complexity during single-layer routing. In some embodiments, the second reflective layer 2091 may be provided with a hollowed-out region at a position where the light emitting element T is positioned, so that the light emitting element T may be connected to the first wire layer 201 or the second wire layer 203 below through the hollowed-out region.

In a specific implementation, the first reflective layer 2092 may be a reflective layer formed through coating, or a reflective layer attached or laminated on the base plate 201.

In some examples, the second reflective layer 2092 is a reflective layer formed on the base plate 201 through a coating process, and the first reflective layer 2091 is a reflective film attached to the base plate 201 or a reflective sheet laminated on the base plate 201.

It should be noted that in a specific implementation, the second reflective layer 2091 coating one side, facing the diffusion plate 31, of the light emitting substrate 2 may be a white mineral oil layer, to reflect light to one side of the diffusion plate 31, so as to increase a light utilization rate. However, in an actual process, the white mineral oil layer may have a non-uniform surface coating thickness or a color mixing error, resulting in color difference. In this way, the first reflective layer 2092 (it may be a while film layer) is arranged on one side, facing the diffusion plate 31, of the second reflective layer 2091. The first reflective layer 2092 may be attached, etc. to one side, facing the diffusion plate 31, of the second reflective layer. The first reflective layer 2092 may increase the light utilization rate and alleviate a color difference between different light emitting sub-substrates 200, and a color difference between different positions in the single light emitting sub-substrate 200. In some embodiments, the first reflective layer 2092 may be of a single film layer structure or a composite structure composed of a plurality of film layers. The first reflective layer 2092 will be provided with a hollowed-out hole at a position corresponding to each light emitting element T. After the first reflective layer 2092 is arranged, a top surface (a surface away from the base plate 201) of the light emitting element T may be flush or substantially flush with a surface, facing the diffusion plate 31, of the first reflective layer 2092, so that the first reflective layer may also protect the light emitting element without bringing negative influence to a light emitting efficiency of the light emitting element. In some examples, the light emitting element includes a light emitting chip and a package structure covering the light emitting chip. Further, a surface of the package structure may be cambered, so that the expression that a top surface of the light emitting element T may be flush or substantially flush with a surface, facing the diffusion plate 31, of the first reflective layer 2092 may also refer to that the surface of the package structure of the light emitting element is flush or substantially flush with the surface, facing the diffusion plate 31, of the first reflective layer 2092. In some embodiments, owing to actual process errors, it may be difficult to realize direct physical contact between each position of the light emitting substrate 2 and the diffusion plate 31. Therefore, the expression that at least some regions of the light emitting substrate 2 is in direct physical contact with the diffusion plate 31 may be that the light emitting element T of the light emitting substrate 2 is in direct physical contact with the diffusion plate 31, the first reflective layer 2092 is in direct physical contact with the diffusion plate 31, or both the light emitting element T and the cover film 2092 are in direct physical contact with the diffusion plate 31. In embodiments of the present disclosure, at least one of the light emitting element T and the first reflective layer 2092 of the light emitting substrate 2 is in direct physical contact with the diffusion plate 31, so that an ultrathin light emitting module having no light mixing distance may be realized.

Figure 4C:
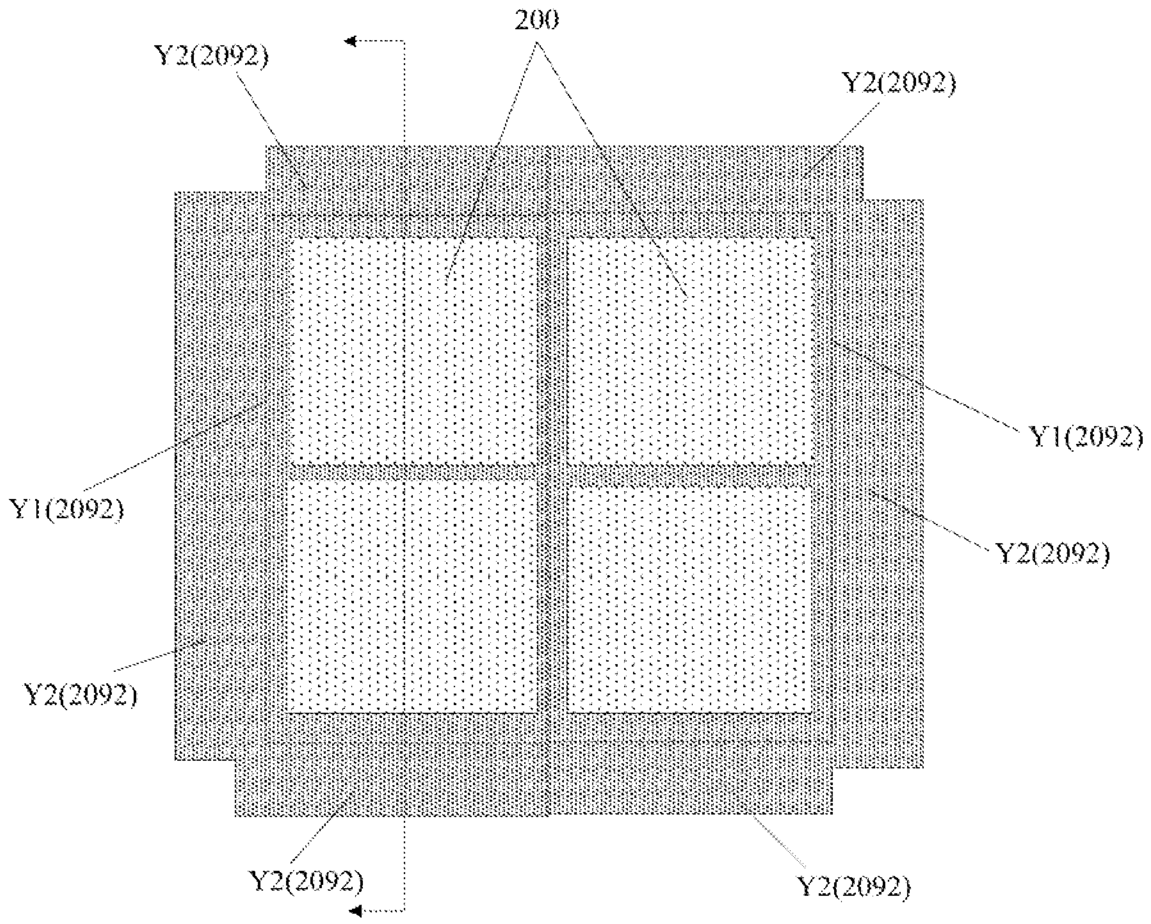
FIG. 4C is a structural schematic diagram of a light emitting sub-substrate and a first reflective layer provided in an embodiment of the present disclosure.
Figure 4D:
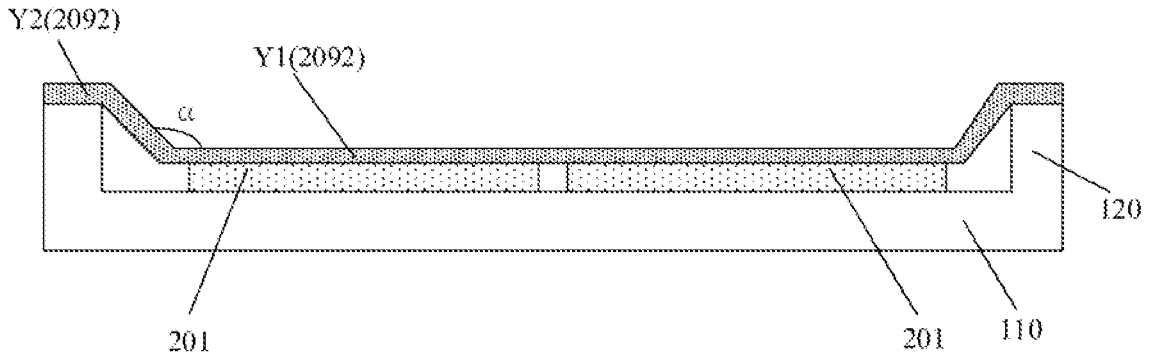
FIG. 4D is a schematic sectional view along a dotted line in FIG. 4C.

In some examples, as shown in FIGS. 4C and 4D, where FIG. 4D is a schematic sectional view along a dotted line in FIG. 4C, the light emitting module includes a backplane 1. The backplane 1 may include: a bottom plate 110, and a side plate 120 extending from the bottom plate 110 towards one side of the diffusion plate 31. The first reflective layer 2092 includes a body portion Y1 and an extension portion Y2, the extension portion Y2 being positioned on at least one side of the body portion Y1. For example, orthographic projections, in a thickness direction of the base plate 201, of all the light emitting elements T on the light emitting substrate 2 are all positioned in a range defined by a peripheral edge of an orthographic projection, in the direction, of the body portion Y1. In some embodiments, the body portion Y1 and the extension portion Y2 are integrated, and a first angle α is formed between the extension portion Y2 and the body portion Y1, the first angle α being not equal to 0. In some embodiments, the first reflective layer 2092 may be in a shape of a reflective sheet and directly laminated on the base plate 201. The extension portion Y2 of the first reflective layer 2092 is bent towards one side of the diffusion plate 31, and further, the extension portion Y2 may be lapped on the side plate 120 of the backplane 1 for fixing. In some embodiments, the extension portion Y2 may be bent in a planar or cambered form, and the extension portion Y2 may be fixedly connected to the backplane 1. In the embodiment of the present disclosure, the first reflective layer 2092 further includes the extension portion Y2, and a first angle is formed between the extension portion Y2 and the body portion Y1, so as to expand a reflective region, and to improve overall brightness of the light emitting module.

In some embodiments, as shown in FIG. 4C, at least two light emitting sub-substrates 200 are arranged corresponding to the same first reflective layer 2092. For example, in FIG. 4C, two light emitting sub-substrates 200 arranged in a vertical direction on the left correspond to a first reflective layer 2092 on the left, two light emitting sub-substrates 200 arranged in a vertical direction on the right correspond to a first reflective layer 2092 on the right, and at least two light emitting sub-substrates 200 are positioned in a region of an orthographic projection, on the base plate 201, of the corresponding first reflective layer 2092. It should be noted that the corresponding to the same first reflective layer 2092 may be interpreted as that the first reflective layer 2092 corresponding to the at least two light emitting sub-substrates 200 is of an integrally-formed and completed-connected structure. In embodiments of the present disclosure, at least two light emitting sub-substrates 200 are arranged corresponding to the same first reflective layer 2092, so as to enhance light emergence uniformity of the light emitting substrate 2, and to reduce the influence from seams between light emitting sub-substrates 200 adjacent to each other on the light emitting uniformity.

In some examples, when at least two light emitting sub-substrates 200 are arranged corresponding to the same first reflective layer 2092, orthographic projections, in the thickness direction of the base plate 201, of all light emitting elements T on the at least two light emitting sub-substrates 200 are all positioned in a range defined by a peripheral edge of an orthographic projection, in the direction, of a body portion Y1 of the same first reflective layer 2092.

Figure 4E:
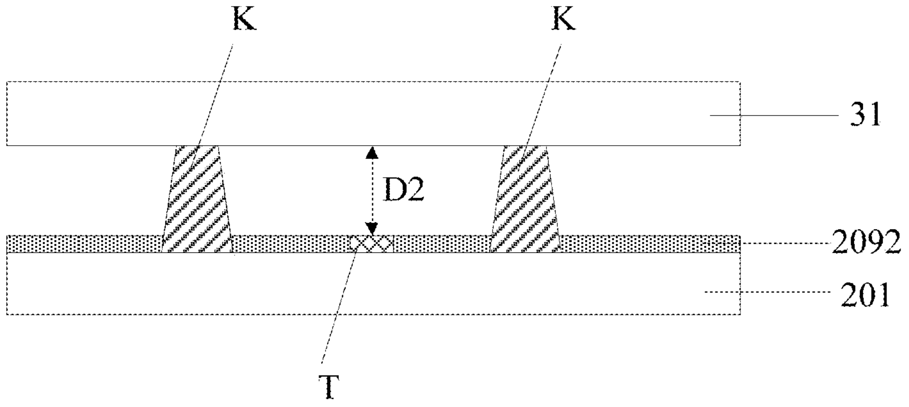
FIG. 4E is a structural schematic diagram of a light emitting module with a support member provided in an embodiment of the present disclosure.

In a specific implementation, as shown in FIG. 4E, the light emitting substrate 2 includes at least one support member K, the support member K being positioned on one side, where the light emitting element T is positioned, of the base plate 201, and the support member K being in direct physical contact with the diffusion plate 31. In some embodiments, the support member K may be fixed to one side, facing the diffusion plate 31, of the base plate 201 in a snap-fit or adhesion manner. For example, an elastic snap-fit structure is arranged on the support member K, and a through hole/groove structure for matching the snap-fit structure is arranged on the base plate 201, to fix the support member K. In some embodiments, the support member K is arranged corresponding to at least one hollow T0, an orthographic projection, on the base plate 201, of the support member K at least partially overlapping an orthographic projection, on the base plate 201, of the corresponding hollow T0.

Figure 4F:
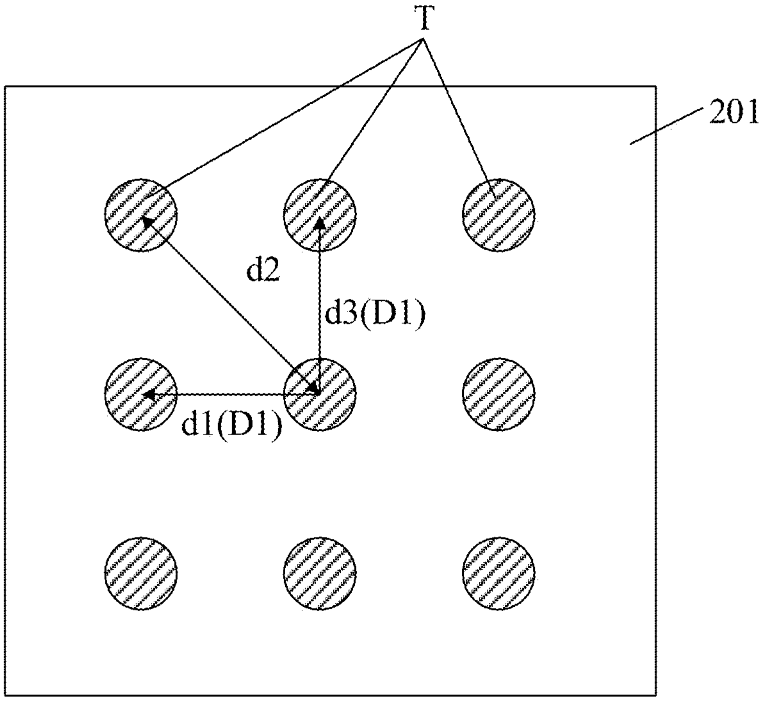
FIG. 4F is a structural schematic distribution diagram of a light emitting element T provided in an embodiment of the present disclosure.

In a specific implementation, as shown in FIGS. 4E and 4F, in a plane parallel to the base plate 201, a minimum distance between centers of any two light emitting elements T adjacent to each other is taken as a first distance D1. For example, a light emitting element T in the second row and the second column in FIG. 4C is schematically described as an example, a first transverse distance d1 is provided between the light emitting element T and a light emitting element T adjacent thereto on the left, a second oblique distance d2 is provided between the light emitting element and a light emitting element T obliquely above, and a third vertical distance d3 is provided between the light emitting element and a light emitting element T right above. The second oblique distance d2 is greater than the first transverse distance d1 and the third vertical distance d3. When the first transverse distance d1 is equal to the third vertical distance d3, any one of d1 and d3 may be taken as the first distance D1. When the first transverse distance d1 is not equal to the third vertical distance d3, a smaller one may be taken as the first distance D1. A distance between the surface, away from the base plate 201, of the light emitting element T and the surface, facing the light emitting substrate 2, of the diffusion plate 31 is taken as a second distance D2, the first distance D1 being great than the second distance D2. In the embodiment of the present disclosure, the first distance D1 is greater than the second distance D2, and the light emitting modules formed by light emitting substrates with different parameters may all reduce a light mixing distance, so as to thin the display device. It should be noted that in FIG. 4C, the light emitting substrate 201 provided with light emitting elements T in 3 rows and 3 columns is schematically described as an example. In a specific implementation, the light emitting substrate 201 may also be provided with light emitting elements T in other numbers of rows and columns, which is not limited by the present disclosure.

Figure 5:
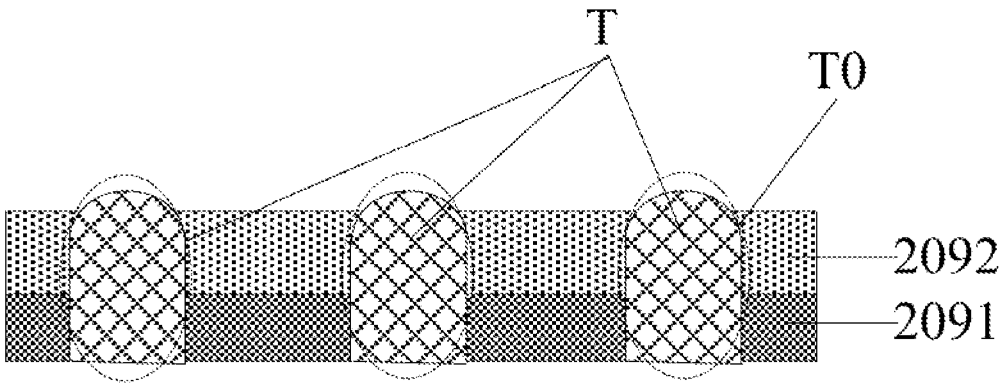
FIG. 5 is a sectional structural schematic diagram of a specific light emitting substrate provided in an embodiment of the present disclosure.

In some embodiments, as shown in FIG. 5, a first adhesive layer, a power supply layer positioned on one side, away from the base plate, of the first adhesive layer, and a first solder mask layer positioned on one side, away from the first adhesive layer, of the power supply layer are further arranged in sequence between the second reflective layer 2091 and the first wire layer 202. One side, away from the base plate, of the second wire layer is further provided with: a second adhesive layer, a ground layer positioned on one side, away from the second wire layer, of the second adhesive layer, and a second solder mask layer positioned on one side, away from the second adhesive layer, of the ground layer in sequence.

In a specific implementation, as shown in FIG. 2C, the light emitting substrate 2 includes a first region BB (a distribution region of the light emitting element T, that is, an outer contour formed by outermost light emitting elements T, and orthographic projections, in a thickness direction of the light emitting substrate 2, of all the light emitting elements T are all positioned in the distribution region), and a second region AA (a region overlapping the display region of the display panel). An orthographic projection, on the light emitting substrate 2, of the second region AA is positioned in the first region BB, and the orthographic projection, on the light emitting substrate 2, of the second region AA is smaller than an orthographic projection, on the light emitting substrate 2, of the first region BB. The second region AA completely overlaps the display region Y of the display panel (that is, an edge of an orthographic projection, in the thickness direction of the light emitting substrate 2, of the second region AA completely overlaps an edge of an orthographic projection, in the direction, of the display region Y of the display panel). The light emitting substrate 2 further includes a third region CC, an orthographic projection, on the light emitting substrate 2, of the third region CC being positioned in the first region BB, and the orthographic projection, on the light emitting substrate 2, of the third region CC not overlapping the orthographic projection, on the light emitting substrate 2, of the second region AA, and a plurality of light emitting elements being arranged in the third region CC.

In a specific implementation, in a direction parallel to a first extension direction AB, a maximum distance h1 between the light emitting element T in the third region CC and an edge of the second region AA is 0.5 mm-1.5 mm, and in some embodiments, may be 0.8 mm. In a direction parallel to a second extension direction CD, a maximum distance h2 between the light emitting element Tin the third region CC and the edge of the second region AA is 0.5 mm-1.5 mm, and in some embodiments, may be 0.8 mm, where the first region BB is a rectangle, the first extension direction AB is an extension direction of a longer side of the rectangle, and the second extension direction CD is an extension direction of a shorter side of the rectangle. That is, the light emitting substrate 2 is further provided with light emitting elements T in regions other than the second region AA. However, when a distance between an outermost light emitting element T on the light emitting substrate 2 and the second region AA is too large, the light emitting element T is wasted, and the light source may not be fully utilized. When a distance is too small, light rays in a peripheral portion of the display region are insufficient, so that a peripheral edge is dark, and a picture quality is influenced. In the embodiment of the present disclosure, in the direction parallel to the first extension direction AB, the maximum distance h1 between the light emitting element T in the third region CC and the edge of the second region AA is 0.5 mm-1.5 mm. In the direction parallel to the second extension direction CD, the maximum distance h2 between the light emitting element T in the third region CC and the edge of the second region is 0.5 mm-1.5 mm. Therefore, the problem that the too small distance will result in the insufficient peripheral light rays and the dark peripheral edge, so as to influence the picture quality may be avoided without wasting the light emitting element T.

Figure 2D:
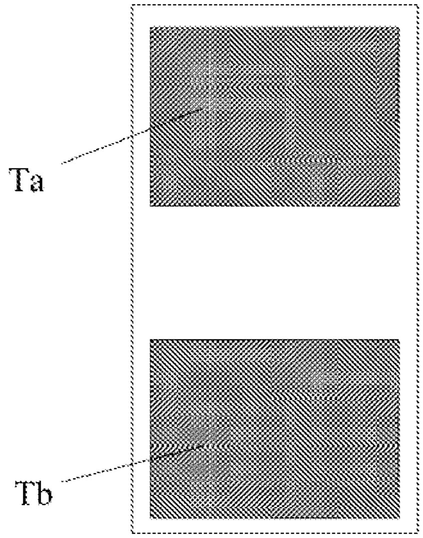
FIG. 2D is a structural schematic diagram of a light emitting element provided in an embodiment of the present disclosure.
Figure 2E:
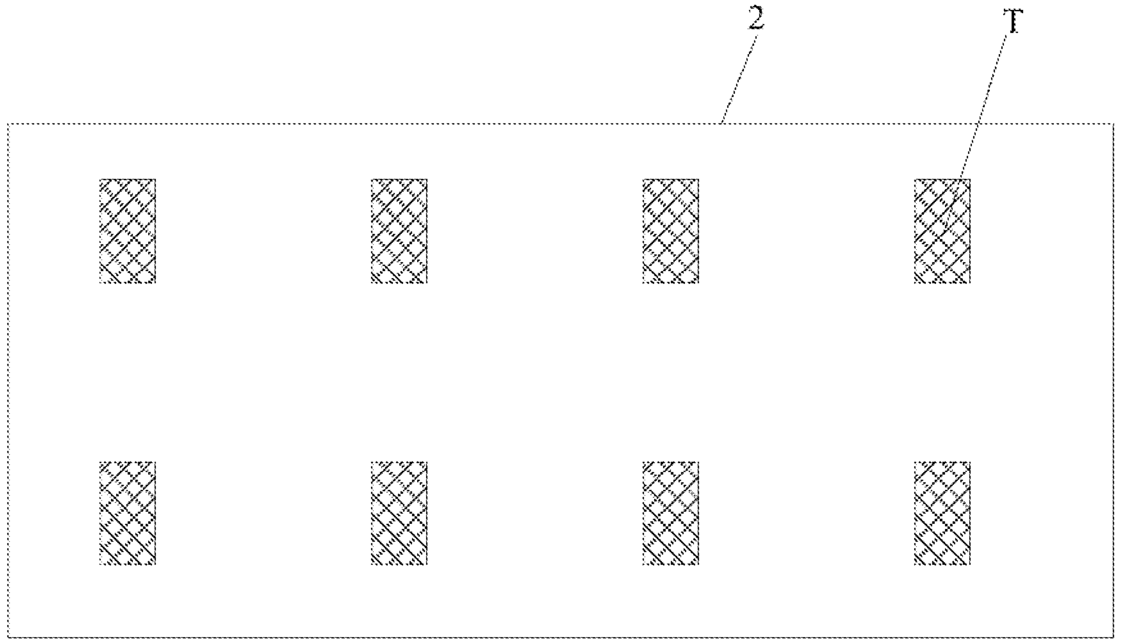
FIG. 2E is a schematic distribution diagram of a light emitting element provided in an embodiment of the present disclosure.

In a specific implementation, a distance h1 between an outer contour of the first region BB and an outer contour of the second region AA in the first extension direction AB is smaller than a distance h2 between an outer contour of the first region BB and an outer contour of the second region AA in the second extension direction CD. In the embodiment of the present disclosure, since the single light emitting element T (may be an unpackaged light emitting chip including a positive electrode Ta and a negative electrode Tb) is rectangular as shown in FIG. 2D, a light quantity distribution, in upper and lower directions of a length direction, of the light emitting element T is greater than a light quantity distribution, in left and right directions of a width direction, of the light emitting element. The light emitting element T is arranged in the light emitting substrate 2 as shown in FIG. 2E, a longer side of the light emitting element T is parallel to a shorter side of the light emitting substrate 2, and a shorter side of the light emitting element T is parallel to a longer side of the light emitting substrate 2. Light emitting brightness in a direction of the longer side of the light emitting substrate 2 is greater than light emitting brightness in a direction of the shorter side of the light emitting substrate 2, and h1 is smaller than h2, so that a non-uniform picture quality may be compensated and adjusted, and a non-uniform peripheral picture caused by different emitting angles of the light emitting elements described above may be alleviated. Specifically, for example, h2 may be 1.100 mm-1.200 mm. In some embodiments, h2 may be 1.147 mm, and h1 may be 0.700 mm-0.800 mm. In some embodiments, h1 may be 0.793 mm. It should be noted that in a specific implementation, it is difficult to make the first region BB a completely regular rectangle due to actual process limitations, and the expression that the first region BB is a rectangle may be interpreted as being substantially a rectangle. In some embodiments, the first region BB may be substantially a rectangle, or a square.

Figure 6A:
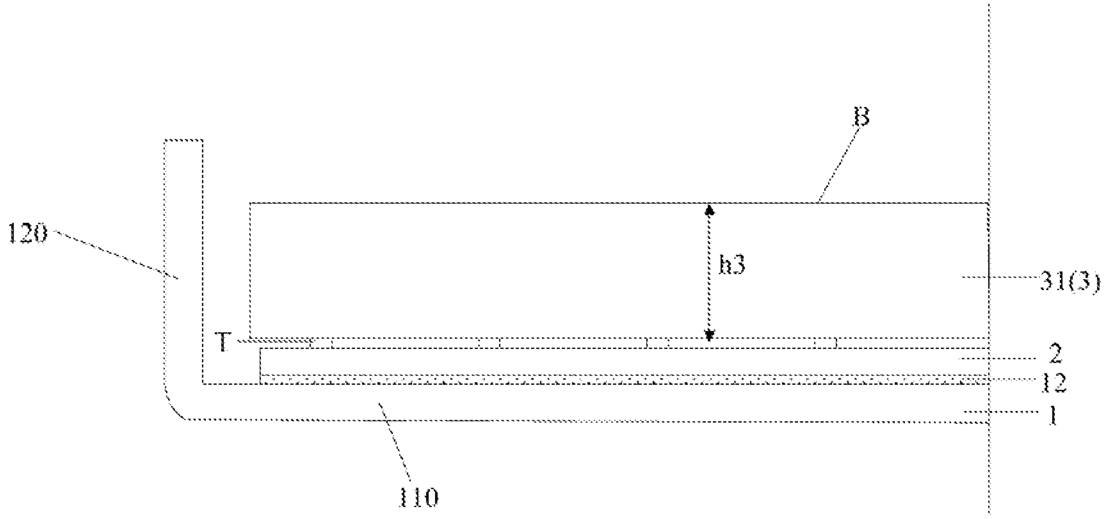
FIG. 6A is a second sectional structural schematic diagram of a light emitting module provided in an embodiment of the present disclosure.
Figure 7:
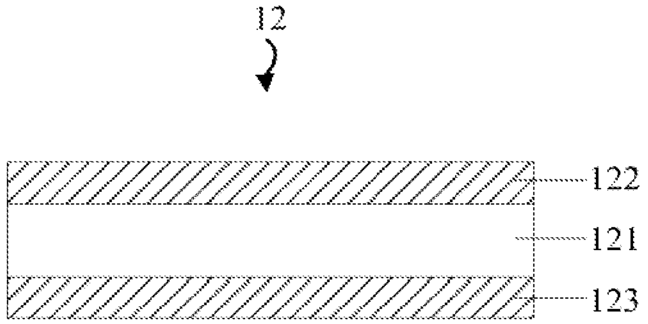
FIG. 7 is a sectional structural schematic diagram of a first adhesive body provided in an embodiment of the present disclosure.

In a specific implementation, as shown in FIG. 6A and FIG. 7, the light emitting module further includes a backplane 1 positioned on one side, away from the diffusion plate 31, of the light emitting substrate 2. The backplane 1 may include: a bottom plate 110, and a side plate 120 extending from the bottom plate 110 towards one side of the diffusion plate 31. One side, facing the backplane 1, of each light emitting sub-substrate 200 is provided with a first adhesive body 12, the light emitting sub-substrate 200 being fixed to the backplane 1 through the first adhesive body 12. In some embodiments, the first adhesive body 12 includes an adhesive body base material 121, a first adhesive layer 122 positioned on one side, facing the light emitting sub-substrate 200, of the adhesive body base material 121, and a second adhesive layer 123 positioned on one side, facing the backplane 1, of the adhesive body base material 121. Compared with a adhesive body structure without a adhesive body base material, in the embodiment of the present disclosure, the first adhesive body 12 includes the adhesive body base material 121, so as to avoid a situation that when the first adhesive body 12 is at a high temperature and high humidity, internal molecules of the first adhesive layer 122 and the second adhesive layer 123 are broken, leading to a layer creep, so that seams of the light emitting sub-substrates 200 are changed to influence a quality of a display picture of the subsequently-formed display device. In some embodiments, the first adhesive layer 122 and the second adhesive layer 123 have the same tape property (having the same materials and tape property ratio), so that an air exhaust property may be improved, that is, no bubbles are generated when the first adhesive layer and the second adhesive layer are bonded to the light emitting sub-substrate 200. In addition, initial adhesion is reduced, and reworkability is improved. Owing to low initial adhesion, the first adhesive body 12 may be easily taken down without replacement and reattached when attached improperly, so as to improve an assembly efficiency, and to ensure that no displacement occurs after a roller is added for pressing. In some embodiments, the first adhesive body 12 may be an easy-to-stretch tape.

Figure 8:
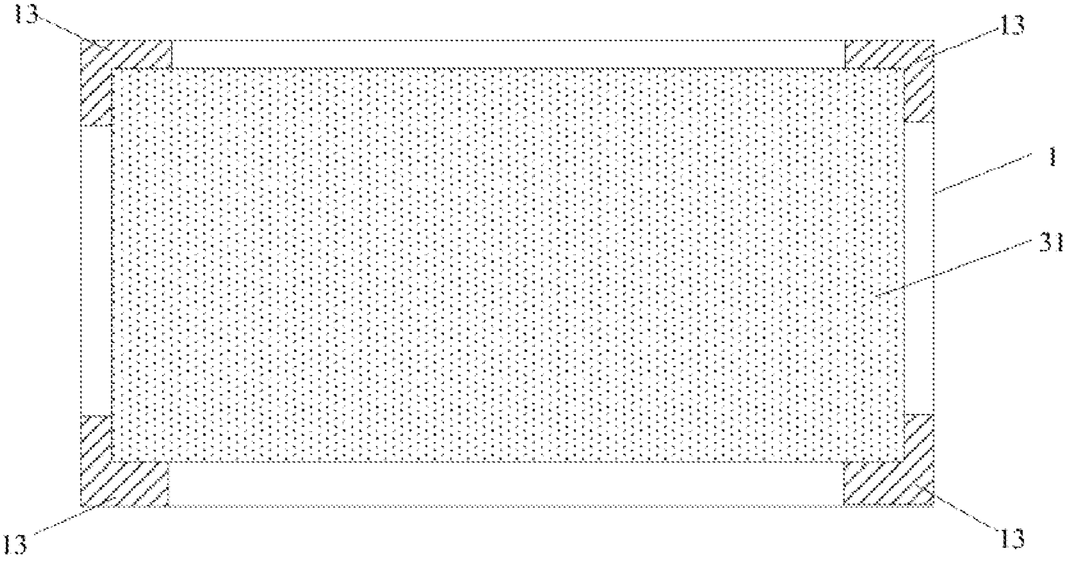
FIG. 8 is a structural schematic diagram of a backplane and a diffusion plate provided in an embodiment of the present disclosure.

In a specific implementation, as shown in FIG. 8, the light emitting module further includes buffer pads 13, the diffusion plate 31 being in contact with the backplane 1 through at least one buffer pad 13. In some embodiments, if the diffusion plate 31 is in direct contact with the backplane 1, the diffusion plate 31 is prone to crack due to an impact during a vibration, and the vibration and expansion may be buffered by the buffer pad 13. For example, the buffer pad 13 includes corner pads as shown in FIG. 8, four corners of the diffusion plate 31 are all in contact with the backplane 1 through the buffer pad 13. When limiting a movement amount of the diffusion plate 31 in the light emitting module, the buffer pad 13 is used to limit a movement amount of the diffusion plate 31 in a direction parallel to the surface, facing the light emitting substrate 2, of the diffusion plate. In the thickness direction of the diffusion plate 31, since the diffusion plate 31 is sandwiched between the light emitting substrate 2 and other optical films of the optical film group 3, where the light emitting substrate 2 is fixed to the backplane 1, and other optical films of the optical film group 3 are limited by a plastic frame, a movement amount of the diffusion plate 31 in the thickness direction thereof is also limited, so as to ensure that the diffusion plate 31 is in direct contact with the light emitting substrate 2 with no gap. In some embodiments, the buffer pad 13 may be an injection-molded cushion block with a hardness of 40 HA (Shore hardness).

In a specific implementation, as shown in FIG. 6A, the diffusion plate 31 may include a diffusion body, and a light diffusion agent and shielding particles mixed in the diffusion body. In some embodiments, the shielding particles may be titanium dioxide. By adjusting a content of the titanium dioxide in a ratio for forming the diffusion plate 31, shielding performance of the diffusion plate 31 may be controlled, so that the diffusion plate 31 is prevented from being of a fully transparent structure while the diffusion plate 31 has a diffusion function. In some embodiments, the diffusion body may be made of polystyrene or polycarbonate, and will carry out refraction, reflection, and scattering in multiple angles and multiple directions when encountering a medium with a different refractive index. Therefore, a traveling route of light is changed, incident light is fully diffused, a softer and more uniform irradiation effect is realized, and a uniform surface light source is provided for a display illumination assembly. In some embodiments, the light diffusion agent may be organic silicon diffusion particles or inorganic diffusion particles. The organic silicon diffusion particles are polymer microspheres connected through silicon-oxygen bonds and having three-dimensional structures. Such light diffusion particles are white powder and added into the diffusion plate 31. Since organic lipophilic group benzyl groups will be uniformly dispersed in a matrix in the form of fine transparent glass spheres, and contain silicon dioxide particles, heat resistance of the diffusion plate may be properly improved. The diffusion body made of the polystyrene or polycarbonate has extrusion molding temperatures of 180°-230°, respectively, and the organic silicon diffusion particles have heat resistance over 400°, so that molecules are not damaged through processing. Owing to a difference in refractive index between the diffusion plate and the diffusion particles, the light source is refracted in a penetrating manner, so that the travelling route of the light is changed to realize the uniform and transparent light, and to satisfy requirements of haze and light transmittance.

In some embodiments, the diffusion plate 31 may have a thickness h3 of 2.5 mm-3.5 mm, so as to avoid a situation that the light rays emitted by the light emitting substrate generate a light spot or lamp shadow on the diffusion plate, further influencing the display effect of the subsequently-formed display device, while an entire thickness of the light emitting module is reduced as much as possible. In a specific implementation, if the distance between light emitting elements T adjacent to each other is too large, even if the light is refracted repeatedly, the amount of light refracted to a middle region between lamps adjacent to each other will be obviously less than the amount of light in a region directly opposite the lamps, resulting in a difference in brightness.

When the diffusion plate features the insufficient diffusivity and/or shielding performance, and a poor diffusion capacity, it is difficult to refract the light rays to the middle region, and the difference in brightness will be directly highlighted when the shielding performance is poor. Increasing the thickness of the diffusion plate 31 increases the refraction times of the light rays, and improves a shielding capacity of the diffusion plate 31.

Figure 6B:
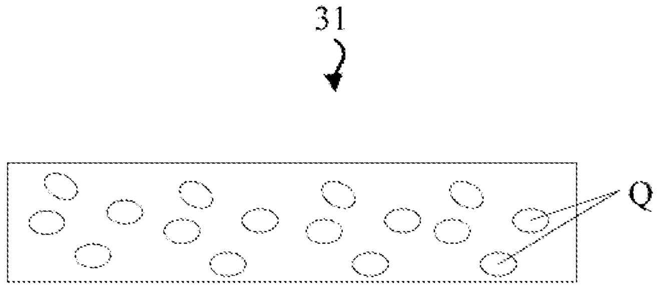
FIG. 6B is a first schematic diagram of a diffusion plate provided in an embodiment of the present disclosure.

In a specific implementation, as shown in FIG. 6B, the diffusion body may include a plurality of closed cavities Q, and the cavity Q may be filled with air (air bubbles). When encountering the cavity Q upon entering the diffusion plate 31, the light rays will be scattered, refracted, and reflected in multiple angles and multiple directions, so as to improve the diffusivity and the shielding performance. Therefore, the thickness of the diffusion plate 31 is further reduced on the premise of ensuring the diffusion effect and shielding effect of the diffusion plate 31, and light emitting module is thinned. In some embodiments, the diffusion particles have the refractive index of 1.43, and the diffusion body is filled with air (with a refractive index of 1.0). After passing through the diffusion body with the refractive index of 1.59, the light rays enter the reflective diffusion plate with a refraction angle greater than the diffusion particles, so that the light rays may be better utilized inside.

Figure 6C:
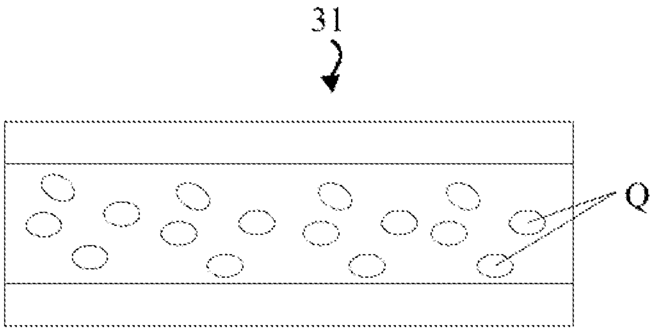
FIG. 6C is a second schematic diagram of a diffusion plate provided in an embodiment of the present disclosure.

In some embodiments, as shown in FIG. 6C, the diffusion plate 31 may be of a multi-layer composite structure, where an intermediate layer may include a plurality of closed cavities Q, so as to avoid a situation that the plurality of closed cavities Q form surface protrusions on upper and lower surfaces of the diffusion plate 31, so that film layers adjacent thereto are damaged.

In a specific implementation, the surface, facing the light emitting substrate 2, of the diffusion plate 31 is provided with a plurality of microstructures, through which the light rays may be refracted in multiple directions, to increase a utilization rate of a light efficiency. The microstructure may be a dented microstructure relative to the surface, facing the light emitting substrate 2, of the diffusion plate 31, so as to prevent the microstructure from scratching the light emitting substrate 2 or the optical film directly adjacent thereto. Further, the plurality of microstructures may be re-cut texture structures, that is, the plurality of microstructures include a plurality of microstructures with different sizes, and are distributed disorderedly.

Figure 9:
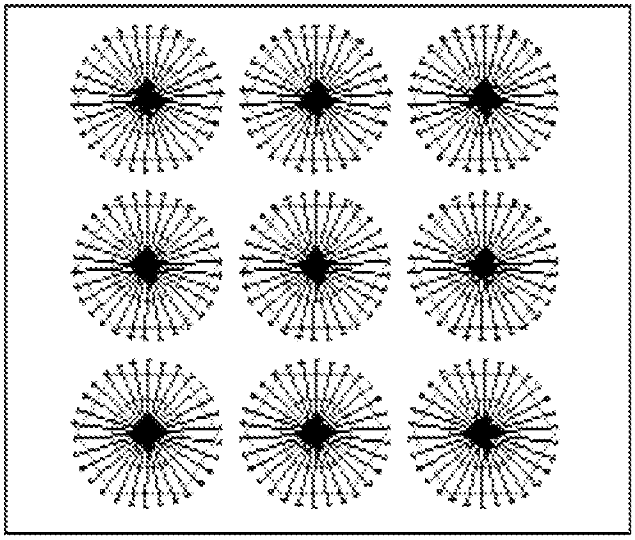
FIG. 9 is a first schematic diagram of a surface of a diffusion plate provided in an embodiment of the present disclosure.

FIG. 9 shows another implementation of the plurality of microstructures. In some embodiments, as shown in FIG. 9, the surface, facing the light emitting substrate 2, of the diffusion plate 31 is provided with 3*3 microstructures. Certainly, in FIG. 9, only the surface, facing the light emitting substrate 2, of the diffusion plate 31 provided with 3*3 microstructures is schematically described. In a specific implementation, the surface, facing the light emitting substrate 2, of the diffusion plate 31 may also be provided with microstructures in other numbers. In some embodiments, the microstructures may be arranged corresponding one-to-one to the light emitting elements T or not. In some embodiments, the microstructure may be a pyramid structure, of which a bottom surface is a virtual surface coplanar with the surface, facing the light emitting substrate 2, of the diffusion plate 31, and the pyramid microstructure is formed through inward denting based on the surface. In some embodiments, the pyramid structure may be a triangular pyramid, a rectangular pyramid, a pentagonal pyramid, or a hexagonal pyramid. In embodiments of the present disclosure, the surface, facing the light emitting substrate 2, of the diffusion plate 31 is provided with the plurality of microstructures, and the microstructures are polyhedral, so that the light utilization rate may be effectively increased, a plurality of surfaces of the microstructures are fully utilized to refract the light rays at multiple angles, and luminance of the diffusion plate may be improved by 8%-10% without changing the shielding performance of the diffusion plate.

In a specific implementation, the surface, away from the light emitting substrate 2, of the diffusion plate 31 has smaller roughness than the surface, facing the light emitting substrate 2, of the diffusion plate 31. In a first aspect, the surface, facing the light emitting substrate 2, of the diffusion plate 31 is provided with the microstructure, so as to increase the utilization rate of the light efficiency, and to improve a light dodging effect of the diffusion plate. In a second aspect, the surface, away from the light emitting substrate 2, of the diffusion plate 31 has smaller roughness than the surface, facing the light emitting substrate 2, of the diffusion plate 31, so as to further prevent the surface microstructure from damaging the optical films adjacent thereto. In some embodiments, the surface, away from the light emitting substrate 2, of the diffusion plate 31 is a smooth surface, that is, the surface has the roughness smaller than a certain threshold value, so as to avoid the risk that the optical film adjacent to the surface is scratched by the diffusion plate.

Figure 10A:
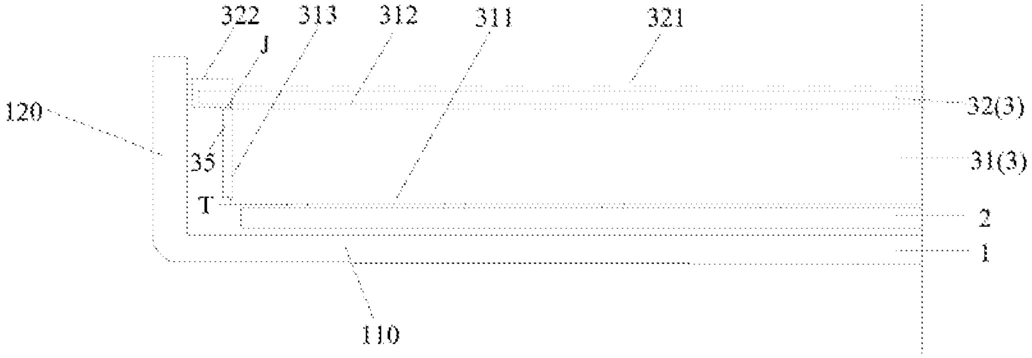
FIG. 10A is a third sectional structural schematic diagram of a light emitting module provided in an embodiment of the present disclosure.
Figure 11:
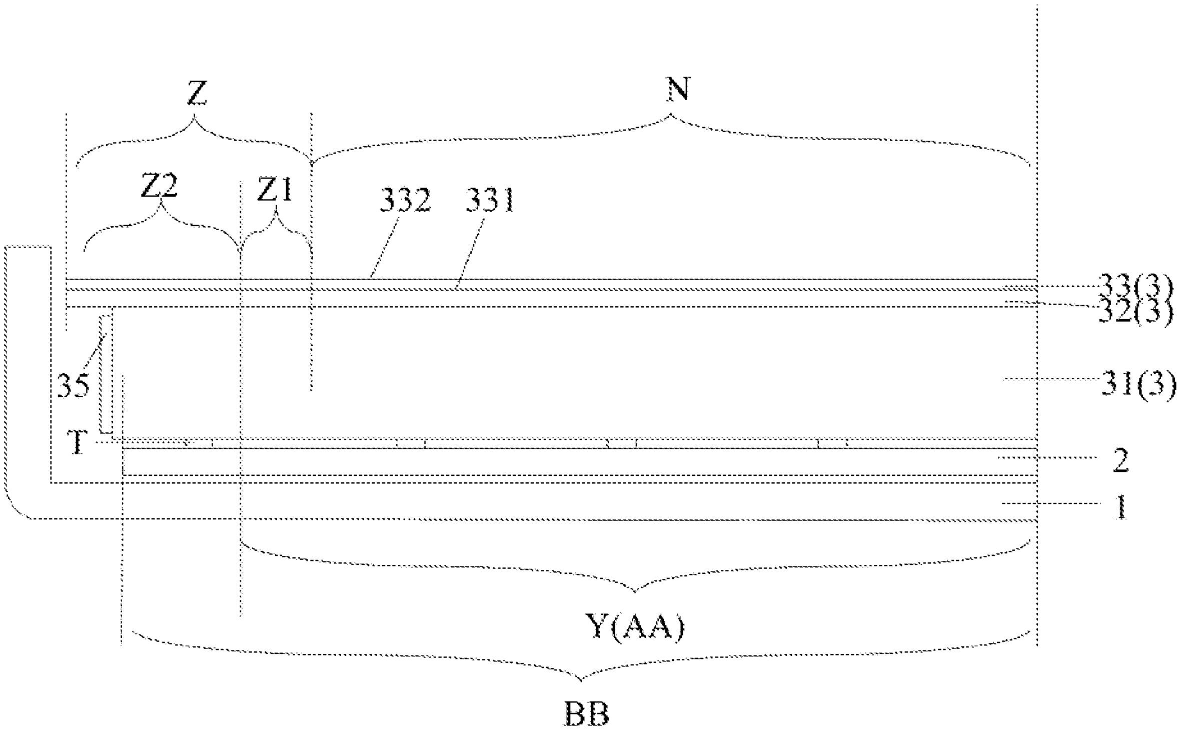
FIG. 11 is a fourth sectional structural schematic diagram of a light emitting module provided in an embodiment of the present disclosure.

In a specific implementation, as shown in FIGS. 10A and 11, the optical film group 3 further includes: a light conversion film 32 positioned on one side, away from the light emitting substrate 2, of the diffusion plate 31. A diffusion sheet 33 may be further arranged on one side, away from the diffusion plate 31, of the light conversion film 32. The light conversion film 32 is positioned between the diffusion plate 31 and the diffusion sheet 33. The light conversion film 32 may convert the light emitted by the light emitting substrate 2 into white light. For example, emergent light from the light emitting element of the light emitting substrate 2 is blue light, and the light conversion film 32 may convert the blue light emitted by the light emitting substrate 2 into the white light. In some embodiments, for example, the light conversion film 32 may include quantum dots, and is a quantum dot light conversion film.

In some embodiments, the diffusion plate 31 is provided with a first diffusion surface 311 facing the light emitting substrate 2, a second diffusion surface 312 facing the light conversion film 32, and at least one side surface 313 connecting the first diffusion surface 311 to the second diffusion surface 312. At least one side surface 313 is provided with a third reflective layer 35. In a direction parallel to the side surface 313 and perpendicular to the second diffusion surface 312, a second gap J is provided between the third reflective layer 35 and the light conversion film 32. In the embodiment of the present disclosure, at least one side surface 313 is provided with the third reflective layer 35. Therefore, when the light rays emitted by the light emitting substrate 2 pass through the diffusion plate 31, to be emitted from the side surface 313, the emitted light rays are further reflected back into the diffusion plate 31, and finally emitted from the second diffusion surface 312, thereby further improving a light emitting efficiency of the light emitting module. When at least one side surface 313 of the diffusion plate 31 is provided with both the third reflective layer 3 and the buffer pad 13, the third reflective layer and the buffer pad may be designed to avoid each other. For example, the third reflective layer 3 is not arranged at a position where the diffusion plate makes contact with the buffer pad, so that a step structure formed by a surface, away from the side surface 313 of the diffusion plate, of the third reflective layer 3, and the side surface 313 of the diffusion plate matches the buffer pad 13 for limiting, thereby assisting in positioning the diffusion plate 313. Moreover, the second gap J is provided between the third reflective layer 35 and the light conversion film 32. Owing to the limitation of an attaching process, the third reflective layer 35 may not be fully attached to side edges of the diffusion plate 31 in a vertical direction, so that a small gap is required. In a first aspect, a situation that the third reflective layer 35 is attached beyond upper and lower surfaces of the diffusion plate 31, to interact with the light conversion film 32 is avoided. In a second aspect, a situation that the third reflective layer is beyond the diffusion plate 31, resulting in a poor picture caused by adhesive overflow is avoided.

Figure 10B:
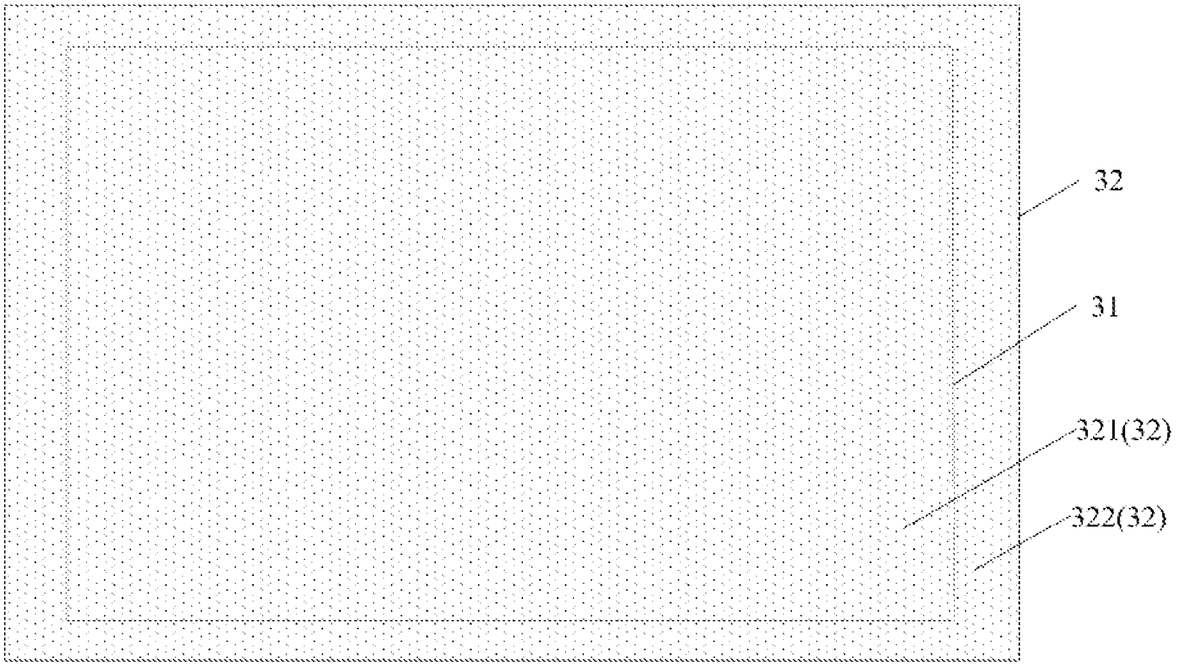
FIG. 10B is a first schematic diagram from a top view of a diffusion plate and a quantum dot film provided in an embodiment of the present disclosure.

In a specific implementation, as shown in FIGS. 10A and 10B, the light conversion film 32 is provided with an overlapping portion 321 overlapping the diffusion plate 31. That is, an orthographic projection, on the diffusion plate 31, of the overlapping portion 321 of the light conversion film 32 overlaps the diffusion plate 31. The light conversion film further includes a conversion film extension portion 322 extending from the overlapping portion 321 towards one side of the side plate 120 of the backplane 1, an orthographic projection, on the light conversion film 32, of the third reflective layer 35 being only positioned in a region where the conversion film extension portion 322 is positioned.

Figure 12B:
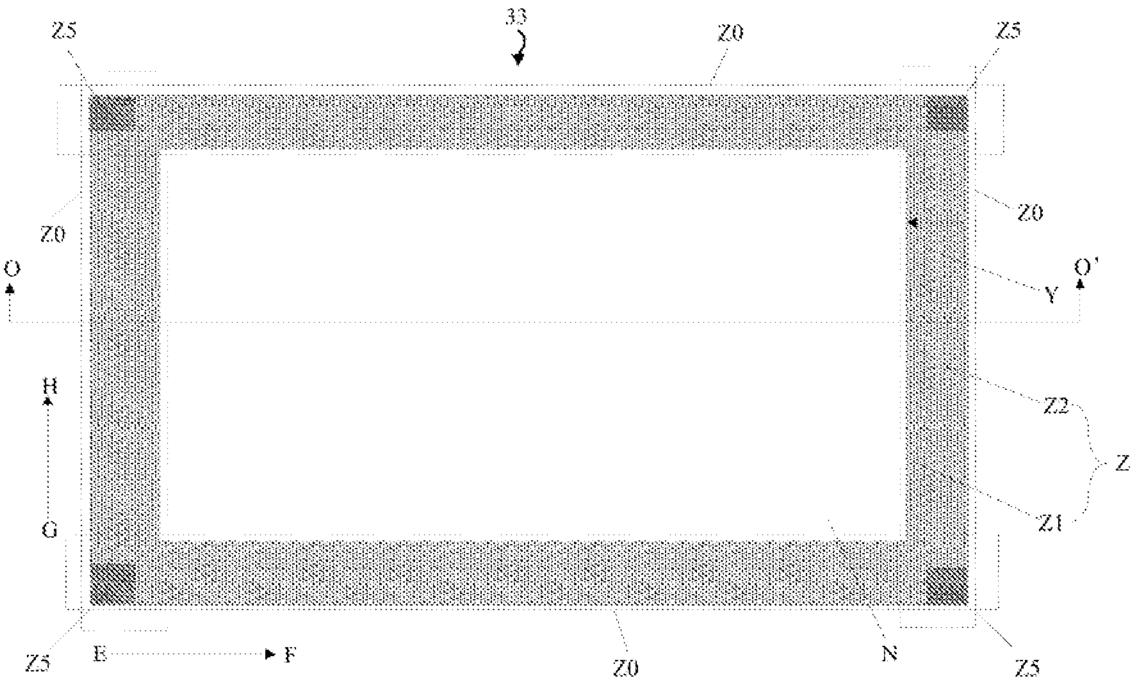
FIG. 12B is a second schematic diagram from a top view of a diffusion sheet provided in an embodiment of the present disclosure.
Figure 13:
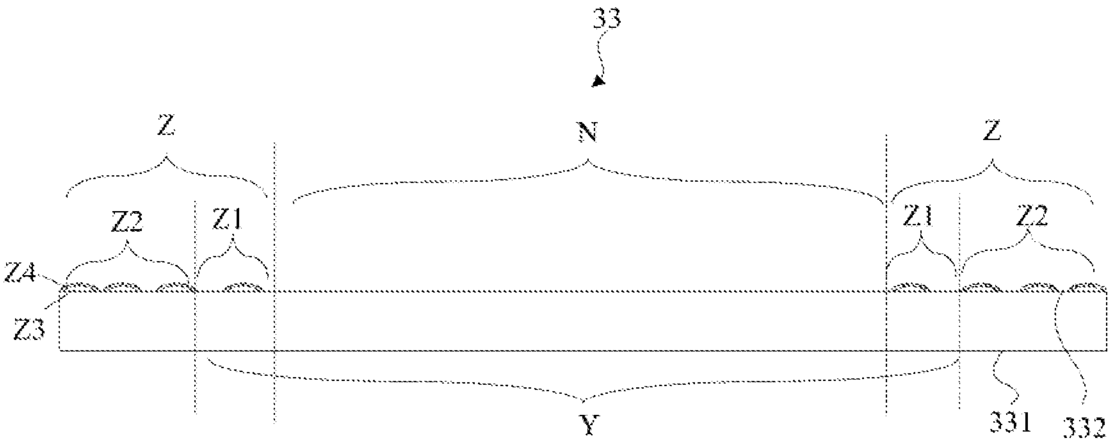
FIG. 13 is a sectional schematic diagram of a diffusion sheet provided in an embodiment of the present disclosure.

It should be pointed out that in a process of implementing infinity display, a hotspot, periphery shine, etc. are difficult to solve. Moreover, currently, the module requires an increasingly narrower frame, and increasingly smaller thickness. With the technology of a narrow frame or even no frame developing, edge shine is generated on the periphery of a display screen. For example, when the light emitting element emits the blue light, the peripheral edge emits the blue light, that is, the obvious color difference is formed between the edge of the display region of the display screen and other positions, which hinders the Mini LED from implementing a display application of the high dynamic range. In view of the above, in a specific implementation, as shown in FIGS. 11, 12B, and 13, where FIG. 13 is a schematic sectional view along OO' in FIG. 12B, the optical film group 3 provided in embodiments of the present disclosure further includes: a diffusion sheet 33 positioned, on one side, away from the diffusion plate 31, of the light conversion film 32. The diffusion sheet 33 includes a first surface 331 facing the diffusion plate 31, and a second surface 332 away from the diffusion plate 31. At least one of the first surface 331 and the second surface 332 of the diffusion sheet 33 is provided with a plurality of microstructure units Z3 (the microstructure unit Z3 may be a dot), and a light conversion material Z4 (the light conversion material may be fluorescent powder) is provided at a position corresponding to each microstructure unit Z3. In some embodiments, the light conversion material Z4 may only cover the position where the microstructure unit Z3 is positioned, and the light conversion material Z4 emits white light when being irradiated with the light emitted by the light emitting substrate 2. In some embodiments, the microstructure unit Z3 may be a recess relative to the first surface 331, and the light conversion material Z4 may have a coating thickness of 3 μm-5 μm. As shown in FIG. 13, the expression that the light conversion material Z4 only covers the position where the microstructure unit Z3 is positioned may be interpreted as that the light conversion material Z4 is only positioned on a surface of the microstructure unit Z3, and no light conversion material is provided between microstructure units Z3 adjacent to each other. In some embodiments, for example, in some regions, a plurality of microstructure units Z3 are distributed at intervals, and light conversion materials Z4 corresponding to the microstructure units Z3 are also distributed at intervals. In some embodiments, the light emitted by the light emitting element T may be the blue light, and the light conversion material Z4 may be a yellow light conversion material. For example, the light conversion material Z4 may be yellow fluorescent powder, and the blue light emitted by the light emitting element T may be converted into the white light after being emitted to the light conversion material.

In a specific implementation, as shown in FIG. 12B, the diffusion sheet 33 includes an inner region N, and a peripheral region Z positioned on at least one side of the inner region N. In some embodiments, the peripheral region Z may be positioned on two sides, opposite each other, of the inner region N, for example, upper and lower sides, or left and right sides of the inner region N as shown in FIG. 12B. Further, the microstructure unit Z3 is positioned only in the peripheral region Z. An orthographic projection, on the diffusion sheet 33, of the second region AA of the light emitting substrate 2 overlaps the peripheral region Z. In embodiments of the present disclosure, at least one of the first surface 331 and the second surface 332 of the diffusion sheet 33 is provided with the plurality of microstructure units Z3 and the corresponding light conversion materials Z4, so as to alleviate blue light leakage from the edge in at least one viewing angle direction, and to improve an impression. In some embodiments, when the peripheral regions Z are formed around the inner region of the diffusion sheet 33, and the plurality of microstructure units Z3 and the light conversion materials Z4 are arranged in each peripheral region, for example, the plurality of microstructure units Z3 are distributed in a ring, and the surfaces of the microstructure units Z3 are covered with the light conversion materials Z4, so that the risk of blue light leakage at any viewing angle may be reduced. It should be noted that the microstructure unit Z3 may be formed on the surface of the diffusion plate through rolling, engraving, etc. During process implementation, control over a density distribution and a size change of the microstructure unit Z3 is flexible and simple. However, it is difficult to directly form the light conversion material with a specific density distribution or size change on an unprocessed diffusion plate plane through an existing process. In the embodiment of the present disclosure, the surface of the formed microstructure unit Z3 is coated with the light conversion material Z4 through a transfer printing process. That is, the light conversion material Z4 only covers the position where the microstructure unit Z3 is positioned, so that an arrangement position of the light conversion material Z4 and a coverage area at the corresponding position may be controlled by adjusting a formation position of the microstructure unit Z3. If the light conversion material Z4 is not only arranged on the microstructure unit Z3, that is, an entire peripheral region of the surface of the diffusion sheet is coated with the light conversion material, a density of the light conversion material Z4 may not be controlled. In the embodiment of the present disclosure, the light conversion material Z4 only covers the position where the microstructure unit Z3 is positioned, and the density of the light conversion material Z4 may be controlled through a distribution of the microstructure units Z3, so that the light conversion material Z4 may be used to convert the blue light leaked from the periphery into the white light with uniform brightness and chromaticity, so as to eliminate a color difference on the periphery.

Figure 12A:
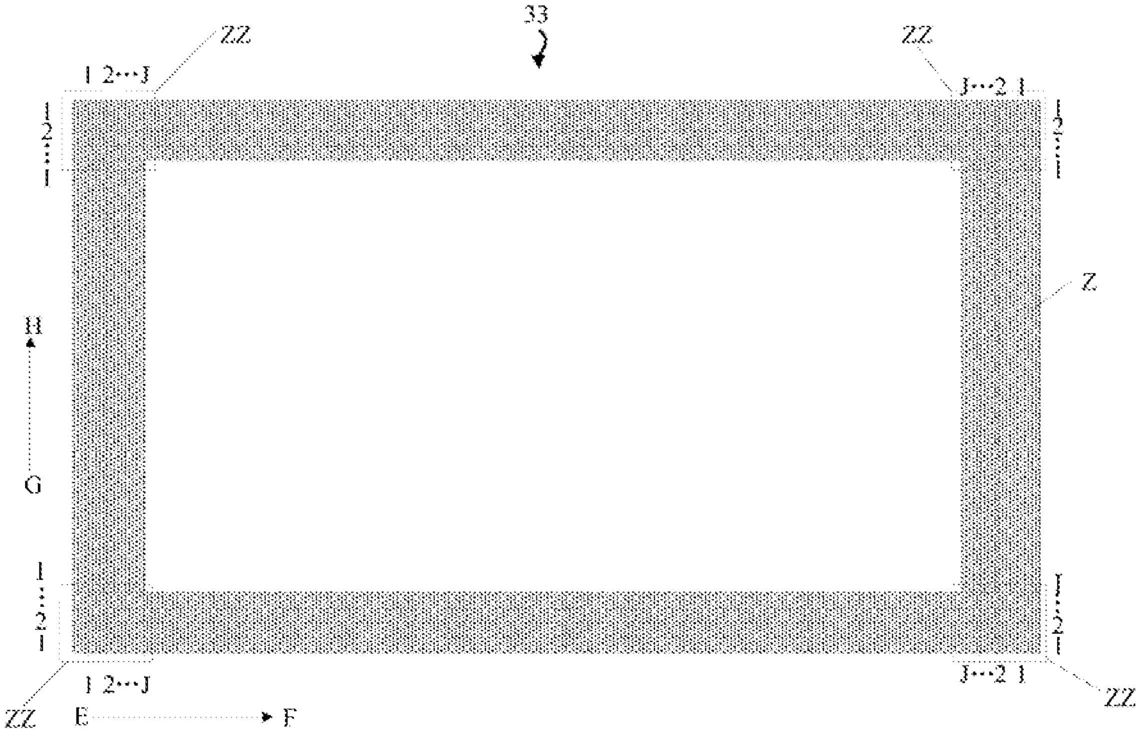
FIG. 12A is a first schematic diagram from a top view of a diffusion sheet provided in an embodiment of the present disclosure.

In a specific implementation, as shown in FIG. 12A, the first surface 331 of the diffusion sheet 33 is a rectangle, an extension direction of a longer side of the rectangle is taken as a third direction EF, and a direction of a shorter side of the rectangle is taken as a fourth direction GH. The peripheral region Z further includes corner regions ZZ, the corner region ZZ being a region formed through an intersection between a portion, extending in the third direction EF, of the peripheral region Z, and a portion, extending in the fourth direction GH, of the peripheral region Z. In some embodiments, the third direction EF may be identical to the second direction CD, and the fourth direction GH may be identical to the first direction AB.

A density distribution of microstructure units Z3 in the corner region ZZ satisfies the following relational expression:

$$Z=\lambda F_x * F_y;$$

in a region between two corner regions adjacent to each other in the third direction, a density distribution of microstructure units satisfies the following relational expression:

$$Z=e^{-\left(\frac{i-12}{16}\right)^2};$$

and in a region between two corner regions adjacent to each other in the fourth direction, a density distribution of microstructure units satisfies the following relational expression:

$$Z=e^{-\left(\frac{j-12}{16}\right)^2};$$

where $$F_x=e^{-\left(\frac{i-12}{16}\right)^2} \text{ and } F_y=e^{-\left(\frac{j-12}{85}\right)^2},$$

each portion, parallel to the third direction EF, of the peripheral region Z is equally divided into I divided regions from outside to inside in sequence in the fourth direction, and each portion, parallel to the fourth direction GH, of the peripheral region Z is equally divided into J divided regions from outside to inside in sequence in the third direction EF, i denoting the ith region, in the fourth direction GH, of the microstructure unit Z3, i=1, 2, . . . I, j denoting a region, in the third direction EF, of the microstructure unit Z3, j=1, 2, . . . J, and λ being an empirical constant.

In some embodiments, $F_X$ is a dot distribution density, in a width direction, of a grid region corresponding to i, and $F_Y$ is a dot distribution density, in a length direction, of a grid region corresponding to j. Z is a dot density in a rectangular region enclosed by ith and jth regions. As shown in FIG. 12B, regions are divided in two directions, for example, i=100, and j=120 (the larger i and j are, the finer the grid division is, but the more difficult the operation is, and values of i and j may be defined according to actual requirements). Since few light rays are present in the corner region ZZ, four corner regions ZZ have a position function of $Z=\lambda F_x*F_y$ (for example, as shown in the corner region ZZ in FIG. 12B, in combination with a region to be provided with dots, 5 grids are used in horizontal and vertical directions respectively herein, that is, i is 1-5, and j is 1-5), and λ is the empirical constant. According to an actual position and a light ray distribution in the corner region ZZ, λ=6 herein, and a density change interval between different grid regions in the length and width directions may be calculated as 42%-84% through substitution, and a density gradually decreases from the corner region ZZ to an interior.

In some embodiments, as shown in FIGS. 11, 12B, and 13, the peripheral region Z may include a first peripheral region Z1, and a second peripheral region Z2, the second peripheral region Z2 being positioned on one side, away from the inner zone N, of the first peripheral region Z1, that is, the first peripheral region Z1 being positioned between the inner region N and the second peripheral region Z2. In some embodiments, the first peripheral region Z1 may be formed into a ring-shaped region surrounding the inner region N, and the second peripheral region Z2 may be formed into a ring-shaped region surrounding the first peripheral region Z1. In some embodiments, the microstructure units Z3 in the first peripheral region Z1 have a smaller average distribution density than those in the second peripheral region Z2. In some embodiments, the average distribution density of the microstructure units Z3 may be interpreted as a proportion of a total projection area of the microstructure units Z3 to a projection area of the region. In the embodiment of the present disclosure, in consideration of light ray distribution characteristics of an edge region in an actual product, the microstructure units Z3 in the first peripheral region Z1 have a smaller average distribution density than the microstructure units Z3 in the second peripheral region Z2, so that the consistent light is emitted from the periphery, a local region on the periphery is prevented from being too bright or too dark, and a local color difference on the periphery may be avoided on the premise that all the microstructure units Z3 are coated with the light conversion materials.

Figure 14:
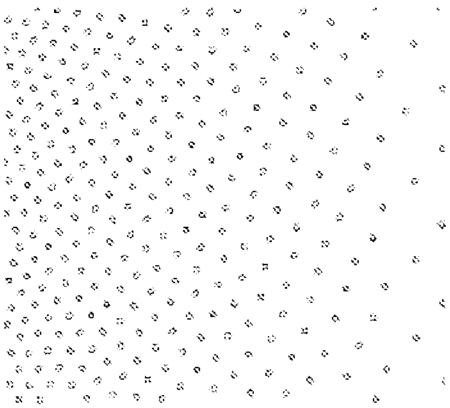
FIG. 14 is a schematic distribution diagram of a microstructure unit provided in an embodiment of the present disclosure.

In some embodiments, in a direction from the second peripheral region Z2 to the first peripheral region Z1, a distribution density, in a unit area, of the microstructure units gradually decreases, as shown in FIG. 14.

In a specific implementation, the microstructure units Z3 in the peripheral region Z may be distributed: disorderly in the third direction EF, and the microstructure units Z3 in the peripheral region are distributed orderly in the fourth direction GH, the first surface 311 is the rectangle, the third direction EF is the extension direction of the longer side of the rectangle, and the fourth direction GH is the extension direction of the shorter side of the rectangle.

In a specific implementation, as shown in FIG. 11, the peripheral region Z overlaps the display region Y. In some embodiments, an outer contour of an orthographic projection, on the diffusion sheet 33, of the first region BB of the light emitting substrate 2 is positioned in the peripheral region Z, and an outer contour of an orthographic projection, on the diffusion sheet 33, of the second region AA is positioned in the peripheral region Z. Specifically, as shown in FIG. 11, the outer contour of the first region BB of the light emitting substrate 2 is positioned in the second peripheral region Z2 of the diffusion sheet 33. In some embodiments, the outer contour of the second region AA of the light emitting substrate 2 is positioned in the peripheral region Z of the diffusion sheet 33, and specifically, the outer contour of the second region AA of the light emitting substrate 2 is positioned in the first peripheral region Z1 of the diffusion sheet 33. Further, an overlapping region is provided between a region of an orthographic projection, in the thickness direction, of the second region AA of the light emitting substrate 2 and a region of an orthographic projection, in the direction, of the first peripheral region Z1 of the diffusion sheet 33, the projection overlapping region having an area greater than 0. In the embodiment of the present disclosure, the outer contour of the orthographic projection of the first region BB and the outer contour of the orthographic projection of the second region AA of the light emitting substrate 2 are both positioned in the peripheral region Z of the diffusion sheet 33, so as to ensure that light rays emitted by outermost light emitting elements T of the light emitting substrate 2 may also be modulated by the microstructure unit Z3 and the light conversion material Z4 on the diffusion sheet 33, thereby completely preventing the blue light from being leaked from the edge. Moreover, the outer contour of the orthographic projection of the second region AA of the light emitting substrate 2 is positioned in the first peripheral region Z1 of the diffusion sheet 33. The outer contour of the orthographic projection of the second region AA overlaps an contour of the display region Y of the display panel. An edge contour of the second region AA has a relatively smaller light leakage amount than an edge contour of the first region BB when the light leakage actually occurs. In addition, the microstructure units Z3 in the first peripheral region Z1 have a smaller distribution density than the microstructure units Z3 in the second peripheral region Z2. Therefore, making the outer contour of the orthographic projection of the second region AA positioned in the first peripheral region Z1 may avoid a situation that owing to a too large distribution density of the microstructure units Z3 and the light conversion materials Z4 in a region, corresponding to the edge of the display region Y, of the light emitting module, a light emitting color difference is formed between the light emitting module and a central region in the region in the end, for example, when the emergent light of the light emitting element T is the blue light, and a color conversion material is yellow fluorescent powder, if the outer contour of the orthographic projection of the second region AA is positioned in the second peripheral region Z2 where the fluorescent powder has a large distribution density, the emergent light rays of the region is slightly yellow, so as to form an obvious color difference with the central region emitting the white light.

In a specific implementation, as shown in FIG. 12B, the second peripheral region Z2 further includes a corner region Z5. The corner region Z5 is a region formed through an intersection between a portion, extending in the first extension direction AB, of the second peripheral region Z2, and a portion, extending in the second extension direction CD, of the second peripheral region Z2. In some embodiments, microstructure units Z3 in the corner region Z5 have a greater average distribution density than microstructure units Z3 in the other regions of the second peripheral region Z2.

In some embodiments, areas and shapes, on the first surface 311 or the second surface 312, of regions of orthographic projections of the microstructure units Z3 may be the same, or gradually changed. In some embodiments, the microstructure unit Z3 may have a shape of an ellipse or circle.

In a specific implementation, as shown in FIG. 13, the microstructure unit Z3 is positioned on the second surface 332, the inner region N of the second surface 332 has substantially the same roughness as the first surface 331, and the first surface 331 has smaller roughness than the peripheral region Z of the second surface 332.

Figure 15A:
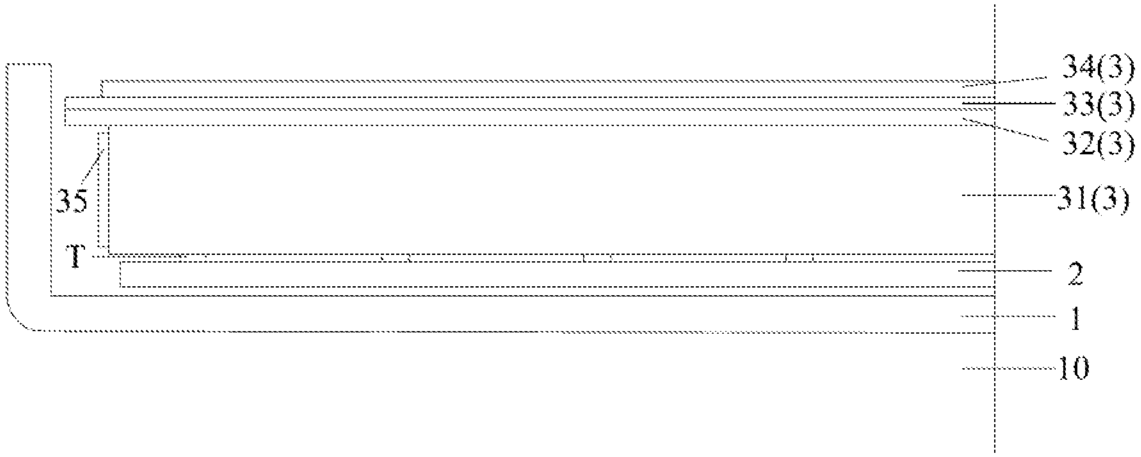
FIG. 15A is a fifth sectional structural schematic diagram of a light emitting module provided in an embodiment of the present disclosure.

In a specific implementation, as shown in FIG. 15A, the optical film group 3 further includes: a composite brightness enhancement sheet 34 positioned on one side, away from the diffusion plate 31, of the diffusion sheet 33, to improve the brightness of the light emitting module.

Figure 15B:
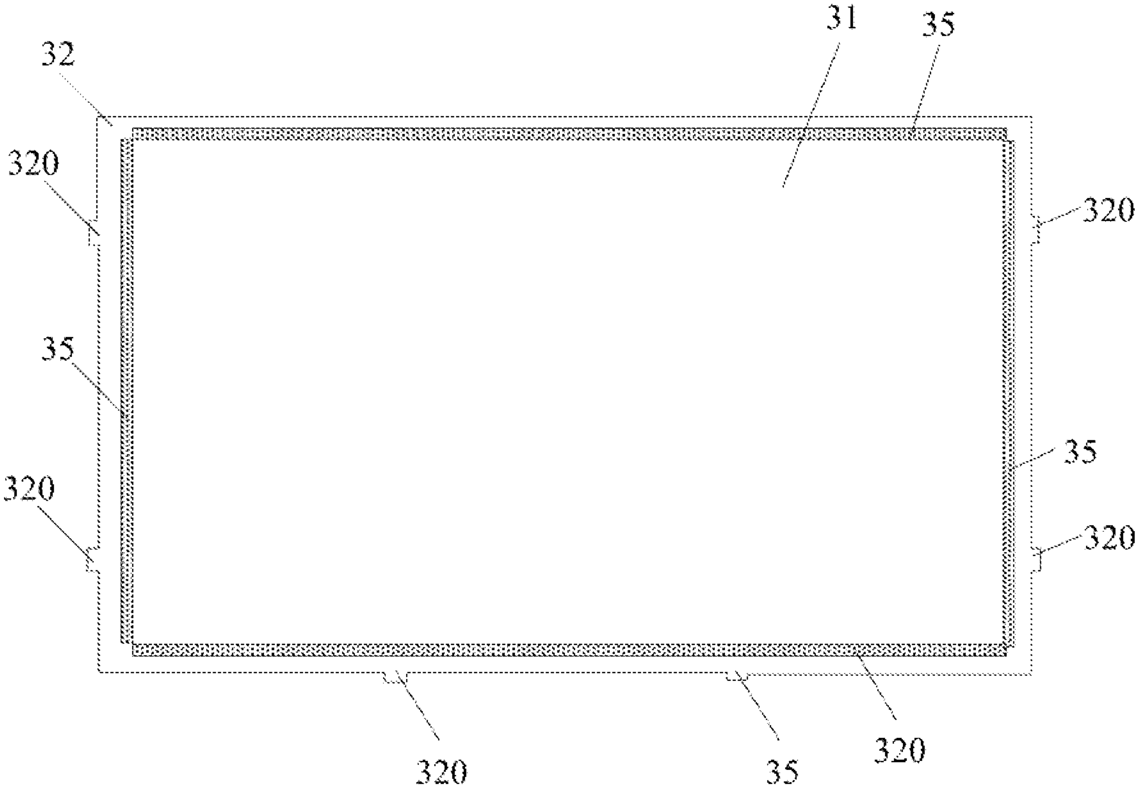
FIG. 15B is a second schematic diagram from a top view of a diffusion plate and a quantum dot film provided in an embodiment of the present disclosure.

In a specific implementation, as shown in FIG. 15B, an outer edge of each light conversion film 32 is provided with lugs 320, the side plate 120 of the backplane 1 is provided with grooves corresponding to the lugs 320, the lug 320 matching the grooves, to position the light conversion film 32. Similarly, outer edges of the diffusion sheet 33 and the composite brightness enhancement sheet 34 are also provided with lugs, and the lugs matching corresponding grooves of the backplane 1, to position the diffusion sheet 33 and the composite brightness enhancement sheet 34.

Figure 16:
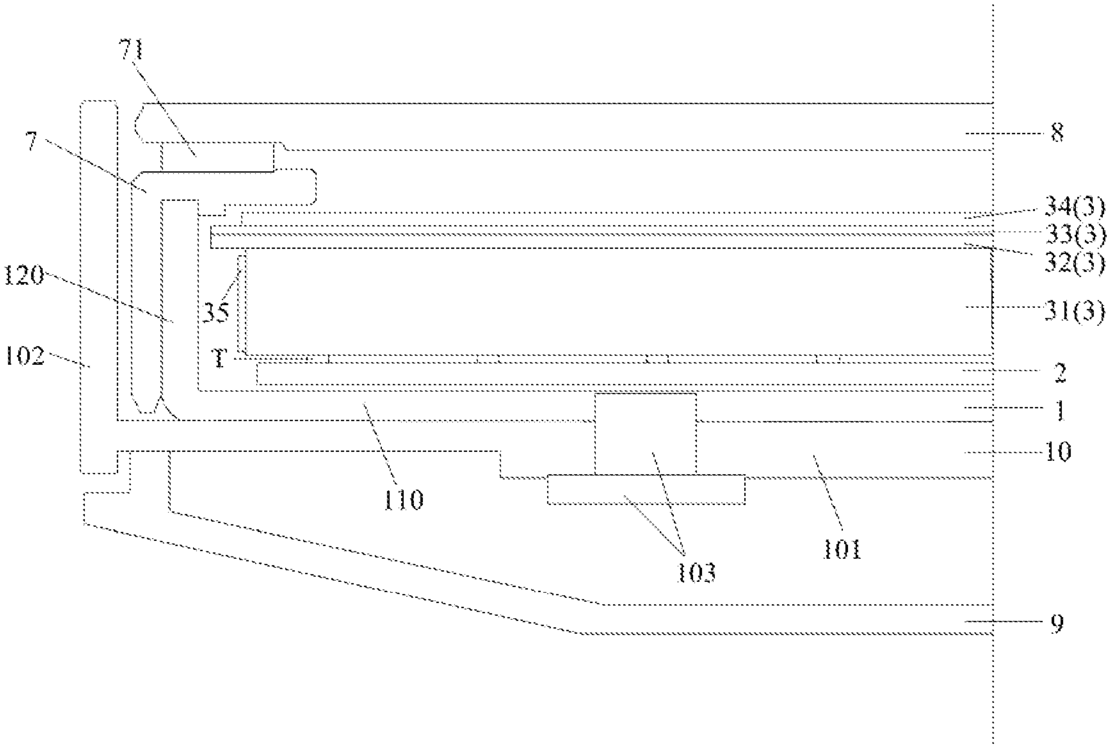
FIG. 16 is a fourth sectional structural schematic diagram of a display device provided in an embodiment of the present disclosure.

An embodiment of the present disclosure further provides a display device. As shown in FIGS. 11 and 16, the display device includes the light emitting module provided in the embodiment of the present disclosure, and a display panel 8 positioned on a light emitting side of the light emitting module. The display panel includes a display region Y and a non-display region positioned on the periphery of the display region Y. In a thickness direction of the display panel, a light emitting substrate 2 is provided with a second region AA overlapping an edge of an orthographic projection of the display region Y. In the thickness direction of the display panel, an orthographic projection of a peripheral region Z of a diffusion sheet 33 overlaps an orthographic projection of the display region Y. Further, an orthographic projection of a first peripheral sub-region Z1 of the diffusion sheet 33 overlaps the orthographic projection of the display region Y.

In a specific implementation, as shown in FIG. 16, the light emitting module further includes: a plastic frame 7 fixed to an end portion of a side plate 120, the display panel 8 being fixed to the plastic frame 7 through foam 71. In some embodiments, a groove may be arranged at a position, facing the side plate 120, of the plastic frame 7, the side plate 120 being capable of being fixed to the plastic frame 7 in a limited manner through the groove.

In a specific implementation, as shown in FIG. 16, the display device further includes: a front frame 10 positioned on one side, away from the light emitting substrate 2, of a backplane 1. The front frame 10 includes: a bottom frame 101 for accommodating the plastic frame 7 and the backplane 1, and a side frame 102 extending from the bottom frame 101 towards one side of the display panel 8, the front frame 10 being fixed to the backplane 1 through a nut 103.

In a specific implementation, as shown in FIG. 16, the light emitting module further includes: a rear housing 9 positioned on one side, away from the backplane 1, of the bottom frame 101, the rear housing 9 being fixed to the front frame 10 through a buckle.

Obviously, a person skilled in the art may make various amendments and variations to the present disclosure without departing from the spirit and scope of the present disclosure. In this way, it is intended that the present disclosure also encompasses these amendments and variations if these amendments and variations to the present disclosure fall within the scope of the claims of the present disclosure and the equivalents thereof.

What is claimed is:

1. A light emitting module, configured to provide a backlight for display panel and comprising:

a light emitting substrate being provided with a plurality of light emitting elements arranged in an array; and an optical film group being positioned on a light emitting side of the light emitting substrate, the optical film group at least comprising a diffusion plate, and orthographic projections of all the light emitting elements positioned on the light emitting substrate being positioned within an orthographic projection of the diffusion plate;

wherein the light emitting substrate comprises: a base plate, and a first reflective layer positioned on one side of the base plate facing the diffusion plate; and the first reflective layer comprises a plurality of hollows arranged at intervals, the hollow being arranged corresponding to the light emitting element, and an orthographic projection of at least one of the light emitting elements being covered by an orthographic projection of a corresponding hollow wherein the first reflective layer comprises a body portion and an extension portion, the extension portion being positioned on at least one side of the body portion.

2. The light emitting module according to claim 1, wherein a surface, away from the base plate, of the first reflective layer is in direct physical contact with the diffusion plate, and/or a surface, away from the base plate, of the light emitting element is in direct physical contact with the diffusion plate.

3. The light emitting module according to claim 1, wherein in a plane parallel to the base plate, a minimum distance between centers of any two light emitting elements adjacent to each other is taken as a first distance; and a distance between the surface, away from the base plate, of the light emitting element, and a surface, facing the light emitting substrate, of the diffusion plate is taken as a second distance, the first distance being greater than the second distance.

4. The light emitting module according to claim 1, wherein the body portion and the extension portion are integrated, and a first angle is formed between the extension portion and the body portion, the first angle being not equal to 0.

5. The light emitting module according to claim 1, wherein the light emitting substrate comprises at least one support member, the at least one support member being positioned on one side where the light emitting element is positioned, of the base plate, and the at least one support member being in direct physical contact with the diffusion plate.

6. The light emitting module according to claim 5, wherein the at least one support member is arranged corresponding to at least one of the hollows, an orthographic projection, on the base plate, of the support member at least partially overlapping an orthographic projection, on the base plate, of a corresponding hollow.

7. The light emitting module according to claim 1, wherein the light emitting substrate further comprises: a second reflective layer positioned between the base plate and the first reflective layer; and a distance between a surface, away from the base plate, of the second reflective layer and the base plate is smaller than a maximum distance between the surface, away from the base plate, of the light emitting element and the base plate.

8. The light emitting module according to claim 7, wherein the light emitting substrate further comprises: a first wire layer positioned between the base plate and the second reflective layer, and a second wire layer positioned on one side, away from the first reflective layer, of the base plate.

9. The light emitting module according to claim 1, wherein the light emitting substrate comprises a plurality of light emitting sub-substrates, the plurality of light emitting sub-substrates being arranged in sequence at least in a first direction and/or a second direction, and the plurality of light emitting sub-substrates being spliced to form the light emitting substrate.

10. The light emitting module according to claim 9, wherein at least two of the light emitting sub-substrates are arranged corresponding to the same first reflective layer, and the at least two light emitting sub-substrates are positioned in a region of an orthographic projection of the same first corresponding reflective layer on the base plate.

11. The light emitting module according to claim 9, wherein a first gap is provided between light emitting sub-substrates adjacent to each other in an arrangement direction of the light emitting sub-substrates, the first gap being 0.08 mm-0.12 mm.

12. The light emitting module according to claim 9, wherein each light emitting sub-substrate is provided with a plurality of light emitting units arranged in an array, each light emitting unit comprising a plurality of light emitting elements connected in series, and the plurality of light emitting elements connected in series being arranged in an array.

13. The light emitting module according to claim 12, wherein the plurality of microstructure units are positioned on the second surface, the inner region of the second surface has a roughness substantially the same as that of the first surface, and the first surface has smaller roughness than that of the peripheral region.

14. The light emitting module according to claim 1, wherein the light emitting substrate comprises a first region and a second region, an orthographic projection, on the light emitting substrate, of the second region being positioned in the first region, and an area of the orthographic projection, on the light emitting substrate, of the second region being smaller than an area of an orthographic projection, on the light emitting substrate, of the first region; the second region overlaps a display region of the display panel; and the light emitting substrate further comprises a third region, an orthographic projection, on the light emitting substrate, of the third region being positioned in the first region, the orthographic projection, on the light emitting substrate, of the third region not overlapping the orthographic projection, on the light emitting substrate, of the second region, and a plurality of light emitting elements being arranged in the third region.

15. The light emitting module according to claim 14, wherein in a direction parallel to a first extension direction, a maximum distance between the light emitting element positioned in the third region and an edge of the second region is 0.5 mm-1.5 mm; and in a direction parallel to a second extension direction, a maximum distance between the light emitting element in the third region and the edge of the second region is 0.5 mm-1.5 mm, wherein the first region is a rectangle, the first extension direction is an extension direction of a longer side of the rectangle, and the second extension direction is an extension direction of a shorter side of the rectangle.

16. The light emitting module according to claim 14, wherein the optical film group further comprises: a diffusion sheet positioned on one side, away from the light emitting substrate, of the diffusion plate, the diffusion sheet comprising a first surface facing the diffusion plate, and a second surface away from the diffusion plate; and at least one of the first surface and the second surface is provided with a plurality of microstructure unit, a light conversion material being arranged at a corresponding position of each microstructure unit.

17. The light emitting module according to claim 16, wherein the diffusion sheet comprises an inner region, and a peripheral region positioned on at least one side of the inner region, an orthographic projection, on the diffusion sheet, of the second region of the light emitting substrate overlapping the peripheral region; and the microstructure unit is only positioned in the peripheral region.

18. The light emitting module according to claim 17, wherein the first surface is a rectangle, an extension direction of a longer side of the rectangle is taken as a third direction, and a direction of a shorter side of the rectangle is taken as a fourth direction; the peripheral region further comprises corner regions, the corner region being a region formed through an intersection between a portion, extending in the third direction, of the peripheral region, and a portion, extending in the fourth direction, of the peripheral region;

a density distribution of the microstructure units in the corner region satisfies the following relational expression:

$$Z = \lambda F_x * F_y;$$

in a region between two corner regions adjacent to each other in the third direction, a density distribution of the microstructure units satisfies the following relational expression:

$$Z = e^{-\left(\frac{i-12}{16}\right)^2};$$

and in a region between two corner regions adjacent to each other in the fourth direction, a density distribution of the microstructure units satisfies the following relational expression:

$$Z = e^{-\left(\frac{j-12}{16}\right)^2};$$

wherein $$F_x = e^{-\left(\frac{i-12}{16}\right)^2}, F_y = e^{-\left(\frac{j-12}{85}\right)^2},$$

and $0<Z<1$, each portion, parallel to the third direction, of the peripheral region is equally divided into I divided regions from outside to inside in sequence in the fourth direction, and each portion, parallel to the fourth direction, of the peripheral region is equally divided into J divided regions from outside to inside in sequence in the third direction, i denoting the ith region, in the fourth direction, of the microstructure unit, i=1, 2, . . . I, j denoting a region, in the third direction, of the microstructure unit, j=1, 2, . . . J, and λ being an empirical constant.

19. The light emitting module according to claim 17, wherein an outer contour of an orthographic projection, on the diffusion sheet, of the first region of the light emitting substrate is positioned in the peripheral region, and an outer contour of an orthographic projection, on the diffusion sheet, of the second region of the light emitting substrate is positioned in the peripheral region.

20. The light emitting module according to claim 19, wherein the peripheral region comprises a first peripheral region and a second peripheral region, the second peripheral region being positioned on one side, away from the inner region, of the first peripheral region; and the microstructure units in the first peripheral region have a smaller average distribution density than those in the second peripheral region.

21. The light emitting module according to claim 20, wherein a distribution density, in a unit area, of the microstructure units is gradually reduced in a direction from the second peripheral region to the first peripheral region.

22. The light emitting module according to claim 20, wherein the outer contour of the orthographic projection, on the diffusion sheet, of the first region of the light emitting substrate is positioned in the second peripheral region, and the outer contour of the orthographic projection, on the diffusion sheet, of the second region of the light emitting substrate is positioned in the first peripheral region.

23. The light emitting module according to claim 20, wherein the second peripheral region further comprises a corner region, the corner region being a region formed through an intersection between a portion, extending in the first extension direction, of the second peripheral region, and a portion, extending in the second extension direction, of the second peripheral region; and the microstructure units in the corner region have a greater average distribution density than those in other regions of the second peripheral region.

24. The light emitting module according to claim 1, further comprising a backplane positioned on one side, away from the diffusion plate, of the light emitting substrate, the backplane comprising: a bottom plate, and a side plate extending from the bottom plate towards one side of the diffusion plate; wherein a first adhesive body is arranged on one side, facing the backplane, of the light emitting substrate, the light emitting substrate being fixed to the backplane through the first adhesive body.

25. The light emitting module according to claim 24, wherein the first adhesive body comprises a adhesive body base material, a first adhesive layer positioned on one side, facing the light emitting sub-substrate, of the adhesive body base material, and a second adhesive layer positioned on one side, facing the bottom plate, of the adhesive body base material.

26. The light emitting module according to claim 1, wherein a surface, facing the light emitting substrate, of the diffusion plate is provided with a plurality of microstructures, the microstructure being a recess relative to the surface, facing the light emitting substrate, of the diffusion plate.

27. The light emitting module according to claim 26, wherein the microstructure is a pyramid structure, a bottom surface of the pyramid structure being a virtual surface coplanar with the surface, facing the light emitting substrate, of the diffusion plate.

28. The light emitting module according to claim 26, wherein a surface, away from the light emitting substrate, of the diffusion plate has smaller roughness than that of the surface, facing the light emitting substrate, of the diffusion plate.

29. The light emitting module according to claim 1, wherein the diffusion plate has a thickness of 2.5 mm-3.5 mm.

30. The light emitting module according to claim 1, wherein the diffusion plate comprises a diffusion body, and a light diffusion agent and shielding particles mixed in the diffusion body.

31. The light emitting module according to claim 1, wherein the diffusion plate comprises a diffusion body and a plurality of closed cavities positioned in the diffusion body, the cavity being filled with air.

32. The light emitting module according to claim 1, wherein the diffusion plate is provided with a first diffusion surface facing the light emitting substrate, a second diffusion surface away from the light emitting substrate, and at least one side surface connecting the first diffusion surface to the second diffusion surface; and at least one of the side surfaces is provided with a third reflective layer.

33. The light emitting module according to claim 32, wherein the optical film group further comprises: a light conversion film positioned between the diffusion plate and the diffusion sheet.

34. The light emitting module according to claim 33, wherein in a direction parallel to the side surface and perpendicular to the second diffusion surface, a second gap is provided between the third reflective layer and the light conversion film.

35. The light emitting module according to claim 1, wherein the light emitting element is a mini light emitting diode (Mini-LED).

36. A display device, comprising the light emitting module according to claim 1, and further comprising: a display panel positioned on a light emitting side of the light emitting module.

* * * * *